United States Patent
Zolfagharkhani et al.

(10) Patent No.: US 10,032,976 B2
(45) Date of Patent: Jul. 24, 2018

(54) MICROELECTROMECHANICAL GYROSCOPES AND RELATED APPARATUS AND METHODS

(71) Applicant: Analog Devices, Inc., Norwood, MA (US)

(72) Inventors: Guiti Zolfagharkhani, Brighton, MA (US); Jan H. Kuypers, Rehau (DE); Alexei Gaidarzhy, Brighton, MA (US); Andrew Sparks, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 572 days.

(21) Appl. No.: 14/485,944

(22) Filed: Sep. 15, 2014

(65) Prior Publication Data
US 2015/0214462 A1 Jul. 30, 2015

Related U.S. Application Data

(63) Continuation of application No. 13/091,018, filed on Apr. 20, 2011, now Pat. No. 8,833,161.

(60) Provisional application No. 61/326,050, filed on Apr. 20, 2010.

(51) Int. Cl.
| | |
|---|---|
| *G01C 19/5684* | (2012.01) |
| *H01L 41/047* | (2006.01) |
| *G01C 19/5755* | (2012.01) |
| *G01C 19/5712* | (2012.01) |
| *H01L 41/053* | (2006.01) |

(Continued)

(52) U.S. Cl.
CPC ........ *H01L 41/047* (2013.01); *G01C 19/5712* (2013.01); *G01C 19/5755* (2013.01); *H01L 41/053* (2013.01); *H01L 41/081* (2013.01); *H01L 41/107* (2013.01)

(58) Field of Classification Search
CPC .................................................. G01C 19/5684
See application file for complete search history.

(56) References Cited

U.S. PATENT DOCUMENTS

| | | |
|---|---|---|
| 4,278,492 A | 7/1981 | Cross |
| 4,364,016 A | 12/1982 | Tanski |
| 4,395,849 A | 8/1983 | Kasai et al. |

(Continued)

FOREIGN PATENT DOCUMENTS

| | | |
|---|---|---|
| EP | 0 375 360 A2 | 6/1990 |
| EP | 0 706 053 A1 | 4/1996 |

(Continued)

OTHER PUBLICATIONS

International Preliminary Report on Patentability and Written Opinion for Application No. PCT/US2006/021298 dated Dec. 6, 2007 and Nov. 6, 2006 respectively.

(Continued)

*Primary Examiner* — John Chapman, Jr.
(74) *Attorney, Agent, or Firm* — Wolf, Greenfield & Sacks, P.C.

(57) ABSTRACT

In one embodiment, an apparatus includes a resonant structure having a plate, a drive electrode and a sense electrode. The resonant structure defines an axis substantially orthogonal to a plane defined by the plate when the resonant structure is not excited. The plate is formed from a piezoelectric material. The drive electrode is configured to excite the resonant structure, and the sense electrode is configured to sense a signal in response to rotation of the resonant structure about the axis.

21 Claims, 33 Drawing Sheets

(51) Int. Cl.
*H01L 41/08* (2006.01)
*H01L 41/107* (2006.01)

(56) References Cited

U.S. PATENT DOCUMENTS

| | | | |
|---|---|---|---|
| 4,442,574 A | 4/1984 | Wanuga |
| 4,454,639 A | 6/1984 | Dworsky |
| 4,538,461 A | 9/1985 | Juptner et al. |
| 4,631,197 A | 12/1986 | Defreese |
| 4,655,081 A | 4/1987 | Burdess |
| 4,750,364 A | 6/1988 | Kawamura et al. |
| 5,226,321 A | 7/1993 | Varnham et al. |
| 5,416,447 A | 5/1995 | Andres |
| 5,438,231 A | 8/1995 | Khoshnevisan et al. |
| 5,501,103 A | 3/1996 | Woodruff et al. |
| 5,677,485 A | 10/1997 | Nakamura |
| 5,679,896 A | 10/1997 | Nakamura et al. |
| 5,736,640 A | 4/1998 | Farine et al. |
| 5,824,903 A | 10/1998 | Takeshi |
| 5,889,208 A | 3/1999 | Nose |
| 5,913,244 A | 6/1999 | Heinouchi |
| 5,914,553 A | 6/1999 | Adams |
| 5,939,956 A | 8/1999 | Arimura |
| 5,969,249 A | 10/1999 | Roessig et al. |
| 6,121,856 A | 9/2000 | Apostolos |
| 6,124,765 A | 9/2000 | Chan |
| 6,209,393 B1 | 4/2001 | Tomikawa et al. |
| 6,420,820 B1 | 6/2002 | Larson |
| 6,453,744 B2 | 9/2002 | Williams |
| 6,577,040 B2 | 6/2003 | Nguyen |
| 6,595,054 B2 | 7/2003 | Paros et al. |
| 6,739,190 B2 | 5/2004 | Hsu |
| 6,745,627 B1 | 6/2004 | Woodruff et al. |
| 6,828,713 B2 | 12/2004 | Bradley |
| 6,831,531 B1 | 12/2004 | Giousouf et al. |
| 6,859,113 B2 | 2/2005 | Giousouf et al. |
| 6,909,221 B2 | 6/2005 | Ayazi et al. |
| 6,943,484 B2 | 9/2005 | Clark et al. |
| 6,954,020 B2 | 10/2005 | Ma et al. |
| 6,975,184 B2 | 12/2005 | Wang et al. |
| 6,987,432 B2 | 1/2006 | Lutz et al. |
| 6,995,622 B2 | 2/2006 | Partridge et al. |
| 7,005,946 B2 | 2/2006 | Duwel et al. |
| 7,024,934 B2 | 4/2006 | Yu |
| 7,068,125 B2 | 6/2006 | Lutz et al. |
| 7,102,467 B2 | 9/2006 | Lutz et al. |
| 7,138,889 B2 | 11/2006 | Lakin |
| 7,170,369 B2 | 1/2007 | Huang et al. |
| 7,211,926 B2 | 5/2007 | Quevy et al. |
| 7,215,061 B2 | 5/2007 | Kihara et al. |
| 7,248,128 B2 | 7/2007 | Mattila et al. |
| 7,310,029 B2 | 12/2007 | Robert et al. |
| 7,327,070 B2 | 2/2008 | Tanaka |
| 7,352,608 B2 | 4/2008 | Mohanty et al. |
| 7,492,241 B2 | 2/2009 | Piazza et al. |
| 7,504,909 B2 | 3/2009 | Tada |
| 7,528,685 B2 | 5/2009 | Tanaka |
| 7,535,152 B2 | 5/2009 | Ogami et al. |
| 7,561,009 B2 | 7/2009 | Larson, III et al. |
| 7,724,103 B2 | 5/2010 | Feng et al. |
| 7,741,752 B2 | 6/2010 | Shih et al. |
| 7,791,432 B2 | 9/2010 | Piazza et al. |
| 7,812,692 B2 | 10/2010 | Ayazi et al. |
| 7,868,517 B2 | 1/2011 | Belot et al. |
| 7,950,281 B2 | 5/2011 | Hammerschmidt |
| 7,954,377 B2 | 6/2011 | Higuchi et al. |
| 7,965,015 B2 | 6/2011 | Tai et al. |
| 8,058,769 B2 | 11/2011 | Chen et al. |
| 8,395,456 B2 | 3/2013 | Badillo et al. |
| 8,487,715 B2 | 7/2013 | Mohanty et al. |
| 8,661,899 B2 | 3/2014 | Zolfagharkhani et al. |
| 8,833,161 B2 | 9/2014 | Zolfagharkhani et al. |
| 2002/0075100 A1 | 6/2002 | Katohno |
| 2002/0158700 A1 | 10/2002 | Nemoto |
| 2003/0034852 A1 | 2/2003 | Kobayashi |
| 2003/0066350 A1 | 4/2003 | Machida |
| 2003/0146674 A1 | 8/2003 | Jacob |
| 2004/0056728 A1 | 3/2004 | Dent |
| 2004/0239450 A1 | 12/2004 | Wang |
| 2004/0250621 A1 | 12/2004 | Fujimoto |
| 2005/0073078 A1 | 4/2005 | Lutz |
| 2005/0110598 A1 | 5/2005 | Larson |
| 2005/0284222 A1 | 12/2005 | Johnson |
| 2006/0117852 A1 | 6/2006 | Park |
| 2006/0283246 A1 | 12/2006 | Weinberg et al. |
| 2007/0188047 A1 | 8/2007 | Tanaka |
| 2007/0222336 A1 | 9/2007 | Grannen |
| 2008/0048804 A1 | 2/2008 | Volatier |
| 2008/0087083 A1 | 4/2008 | Nishizawa et al. |
| 2008/0115579 A1 | 5/2008 | Seeger et al. |
| 2008/0143217 A1 | 6/2008 | Ho |
| 2008/0196498 A1 | 8/2008 | Suzuki |
| 2008/0204153 A1 | 8/2008 | Yoshida |
| 2008/0272852 A1 | 11/2008 | Six |
| 2008/0284286 A1 | 11/2008 | Ogawa |
| 2008/0297281 A1 | 12/2008 | Ayazi |
| 2009/0026882 A1 | 1/2009 | Steeneken |
| 2009/0103381 A1 | 4/2009 | Buchwalter |
| 2009/0108381 A1 | 4/2009 | Buchwalter |
| 2009/0108959 A1 | 4/2009 | Piazza |
| 2009/0144963 A1 | 6/2009 | Piazza |
| 2009/0243747 A1 | 10/2009 | Gaidarzhy |
| 2009/0255338 A1 | 10/2009 | Watanabe |
| 2009/0294638 A1 | 12/2009 | Mohanty |
| 2010/0007443 A1 | 1/2010 | Mohanty |
| 2010/0026136 A1 | 2/2010 | Gaidarzhy |
| 2010/0038991 A1 | 2/2010 | Shih et al. |
| 2010/0134207 A1 | 6/2010 | Mohanty |
| 2010/0155883 A1 | 6/2010 | Wenzler |
| 2010/0181868 A1 | 7/2010 | Gaidarzhy |
| 2010/0182102 A1 | 7/2010 | Kuypers |
| 2010/0237959 A1 | 9/2010 | Tanaka |
| 2014/0137648 A1 | 5/2014 | Zolfagharkhani et al. |

FOREIGN PATENT DOCUMENTS

| | | |
|---|---|---|
| EP | 0 707 212 A2 | 4/1996 |
| EP | 0 791 832 A1 | 8/1997 |
| EP | 1 505 722 A2 | 2/2005 |
| WO | WO 98/01948 A1 | 1/1998 |
| WO | WO 98/37635 A1 | 8/1998 |
| WO | WO 02/17481 A2 | 2/2002 |
| WO | WO 2006/000611 A1 | 1/2006 |
| WO | WO 2006/083482 A2 | 8/2006 |
| WO | WO 2006/130777 A2 | 12/2006 |
| WO | WO 2007/072408 A2 | 6/2007 |
| WO | WO 2007/072409 A2 | 6/2007 |
| WO | WO 2007/143520 A2 | 12/2007 |
| WO | WO 2010/011288 A1 | 1/2010 |

OTHER PUBLICATIONS

International Search Report and Written Opinion dated Feb. 26, 2010 for Application No. PCT/US2009/006587.
International Preliminary Report on Patentability dated Jun. 30, 2011 for Application No. PCT/US2009/006587.
International Search Report and Written Opinion dated Mar. 1, 2010 for Application No. PCT/US2009/006590.
International Preliminary Report on Patentability dated Jun. 30, 2011 for Application No. PCT/US2009/006590.
International Search Report and Written Opinion dated Sep. 3, 2010 for Application No. PCT/US2010/000301.
International Preliminary Report on Patentability dated Aug. 18, 2011 for Application No. PCT/US2010/000301.
International Search Report and Written Opinion dated Apr. 29, 2011 for Application No. PCT/US2011/026668.
International Preliminary Report on Patentability dated Sep. 13, 2012 for Application No. PCT/US2011/026668.
International Preliminary Report on Patentability dated Nov. 1, 2012 for Application No. PCT/US2011/033268.
Di Pietrantonio et al., Guided lamb wave electroacoustic devices on micromachined AlN/Al plates. IEEE Trans Ultrason Ferroelectr

(56) References Cited

OTHER PUBLICATIONS

Freq Control. May 2010;57(5):1175-82. doi: 10.1109/TUFFC.2010. 1530.

Driscoll et al., Voltage-Controlled Crystal Oscillators. IEEE Transactions on Electron Devices. Aug. 1971;18(8):528-35.

Driscoll, Linear Frequency Tuning of Saw Resonators. IEEE Trans Ultrason Ferroelectr Freq Control. 1991;38(4):366-9.

Humad et al., High Frequency Micromechanical Piezo-on-Silicon Block Resonators. International Electron Devices Meeting. Washington, D.C. Dec. 8-10, 2003, New York, NY IEEE US Dec. 8, 2003. Technical Digest. 957-60.

Kadota et al., High-frequency Lamb wave device composed of MEMS structure using LiNbO3 thin film and air gap. IEEE Trans Ultrason Ferroelectr Freq Control. Nov. 2010;57(11):2564-71. doi: 10.1109/TUFFC.2010.1722.

Onoe, Several Extensions of Mindlin-Gazis's Analysis of Rotated Y-Cut of Quartz (Invited). Frequency Control Symposium, 2008 IEEE International. Honolulu, HI, May 19-21, 2008. 10-8.

Parker, Precision Surface-Acoustic-Wave (SAW) Oscillators. IEEE Transactions on Ultrasonics, Ferroelectrics, and Frequency Control. May 1988;35(3):342-64.

Piazza et al., Low Motional Resistance Ring-Shaped Contour-Mode Aluminum Nitride Piezoelectric Micromechanical Resonators for UHF Applications. 18th IEEE International Conference on Micro Electro Mechanical Systems, 2005. MEMS 2005. Miami Beach, Florida. Jan. 30-Feb. 3, 2005;20-3. doi: 10.1109/MEMSYS.2005. 1453857.

Reinhardt et al., Simulation of Baw Resonators Frequency Adjustment. IEEE 2007 Ultrasonics Symposium. New York, NY. Oct. 28-31, 2007;1444-7. doi: 10.1109/ULTSYM.2007.363.

Tirole et al., Lamb Waves Pressure Sensor Using an AlN/Si Structure. Proceedings of IEEE 1993 Ultrasonics Symposium. Baltimore, MD. Oct. 31-Nov. 3, 1993;1:371-4. doi: 10.1109/ULTSYM.1993. 339466.

Uno, Frequency Trimming of Saw Devices. Proceedings of IEEE 1994 Ultrasonics Symposium. Cannes, France. Oct. 31-Nov. 3, 1994;1:181-7. doi: 10.1109/ULTSYM.1994.401576.

Wang et al., In-Situ Frequency Trimming of Saw Resonator Using Conventional Crystal Resonator Fine Tuning Method With Gold Thin Film Addition. 2003 IEEE Symposium on Ultrasonics. Oct. 5-8, 2003;2:1730-3. doi: 10.1109/ULTSYM.2003.1293245. 4 pages.

Wang et al., Method of Fabricating Multiple-Frequency Film Bulk Acoustic Resonators in a Single Chip. 2006 IEEE International Frequency Control Symposium and Exposition. Miami, FL. Jun. 2006;793-6.

Wang et al., The Analysis of the Third-Order Thickness-Shear Overtone Vibrations of Quartz Cristal Plates With Mindlin Plate Theory. 2008 IEEE International Ultrasonics Symposium Proceedings. Beijing, China. Nov. 2-5, 2008;2173-6. doi: 10.1109/ULTSYM.2008.0538.

Wingqvist et al., A Micromachined Thermally Compensated Thin Film Lamb Wave Resonator for Frequency Control and Sensing Applications. J Micromech Microeng. 2009;19(3):035018. doi: 10.1088/0960-1317/19/3/035018 . 9 pages.

Yatsuda et al., Flip-Chip Stw Filters and Frequency Trimming Method. 2002 IEEE International Frequency Control Symposium and PDA Exhibition. 2002; 366-9. doi: 10.1109/FREQ.2002. 1075910.

International Search Report in corresponding PCT Application No. PCT/US2011/033268, filed Apr. 20, 2011, 1 page.

MICROELECTROMECHANICAL GYROSCOPES AND RELATED APPARATUS AND METHODS

CROSS REFERENCE TO RELATED APPLICATIONS

This application is a continuation of U.S. patent application Ser. No. 13/091,018, filed on Apr. 20, 2011, entitled "Microelectromechanical Gyroscopes and Related Apparatus and Methods," which claims priority to U.S. Application Ser. No. 61/326,050, filed on Apr. 20, 2010, and entitled "Microelectromechanical Gyroscopes and Related Apparatus and Methods," the entire disclosure of each of which is incorporated herein by reference.

BACKGROUND

In some embodiments, microelectro mechanical (MEMS) gyroscopes are described, specifically piezoelectric MEMS gyroscopes.

Conventional microelectromechanical systems (MEMS) gyroscopes are electrostatic in nature, using electrostatic actuation and/or detection of the motion of a proof mass.

SUMMARY

In one embodiment, an apparatus includes a resonant structure having a plate, a drive electrode and a sense electrode. The resonant structure defines an axis substantially orthogonal to a plane defined by the plate when the resonant structure is not excited. The plate is formed from a piezoelectric material. The drive electrode is configured to excite the resonant structure, and the sense electrode is configured to sense a signal in response to rotation of the resonant structure about the axis.

DETAILED DESCRIPTION

Some embodiments relate to piezoelectric MEMS gyroscopes, configured to be actuated, detected, and/or sensed using piezoelectric behavior. In some embodiments, the gyroscopes may be configured to sense rotation about the z-axis, and therefore may be referred to herein as z-axis gyroscopes, i.e., configured to detect rotation of the structure about its z-axis. The piezoelectric MEMS gyroscopes described herein can include a piezoelectric material and use piezoelectric excitation, detection, and/or sensing of the structure. Various embodiments will be described for illustration purposes, though it should be appreciated that these embodiments are not limiting. Also, it should be appreciated that the various aspects described herein may be used individually, all together, or in any combination of two or more, as the technology is not limited in this respect.

In one embodiment, an apparatus includes a resonant structure having a plate, a drive electrode and a sense electrode. The resonant structure defines an axis substantially orthogonal to a plane defined by the plate when the resonant structure is not excited. The plate is formed from a piezoelectric material. The drive electrode is configured to excite the resonant structure, and the sense electrode is configured to sense a signal in response to rotation of the resonant structure about the axis.

In another embodiment, an apparatus includes a resonant structure formed from a piezoelectric material and including a drive electrode. The resonant structure defining a plane when not excited and defining an axis substantially orthogonal to a plane. The drive electrode is configured to excite the resonant structure in a first mode. The resonant structure is configured to oscillate in a second mode upon rotation about the axis and when excited by the drive electrode.

In another embodiment, a method includes exciting a resonant structure using a first mode, and measuring an oscillation of the resonant structure upon rotation of the resonant structure and after exciting the resonant structure.

Figure 1A:
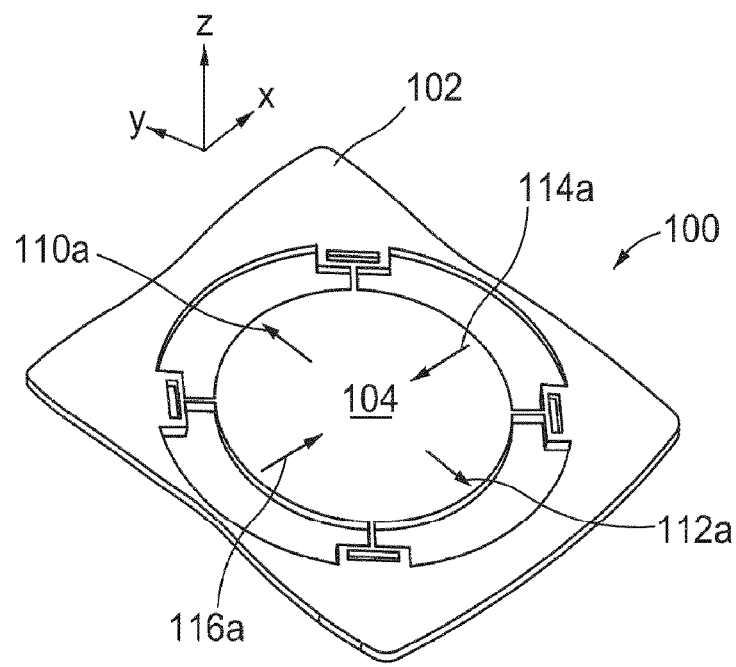
FIG. 1A is a perspective view of a gyroscope operating in the primary elliptical mode according to an embodiment in a first configuration.
Figure 1B:
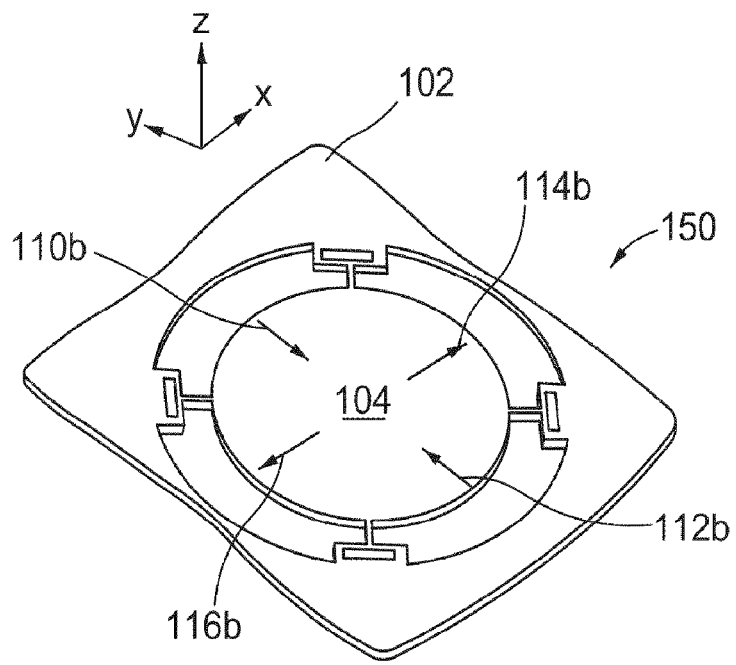
FIG. 1B is a perspective view of the gyroscope in a second configuration.

FIG. 1A is a perspective view showing a disk structure 100 of a gyroscope according to an embodiment in a first configuration (e.g. a first half cycle), and FIG. 1B is a perspective view showing the disk structure 100 in the second configuration (e.g. a second half cycle). A suspended disk 104 is connected to a substrate 102 by anchors, such as, for example, four anchors, which may be of any suitable type. In some embodiments, suspended disk 104 can be connected to a substrate by more or fewer anchors. According to one embodiment, the anchors may be of the type described in U.S. patent application Ser. No. 12/732,575, filed on Mar. 26, 2010, and entitled "Mechanical Resonating Structures and Methods" which is hereby incorporated herein by reference in its entirety. Suspended disk 104 can be a resonating structure. In some embodiments as described herein, other resonating structures, such as for example, rings or one or more plates (e.g. proof masses). In some embodiments, the resonating structure can include silicon. One possible mechanical vibration mode of structure 100 is a primary elliptical mode (referred to interchangeably as "wine-glass mode"), and is indicated by the arrows 110a, 112a, 114a and 116a. The primary elliptical mode can be the (2,1) mode (e.g., (the first radial harmonic of circumferential mode order 2), and can be characterized by predominantly in-plane extensional vibrations The vibration of the disk structure 100 for the other half cycle is illustrated in FIG. 1B. The arrows indicate the contraction and extension of the disk according to the arrows 110b, 112b, 114b and 116b. The primary elliptical mode can be the primary vibration mode.

Figure 2A:
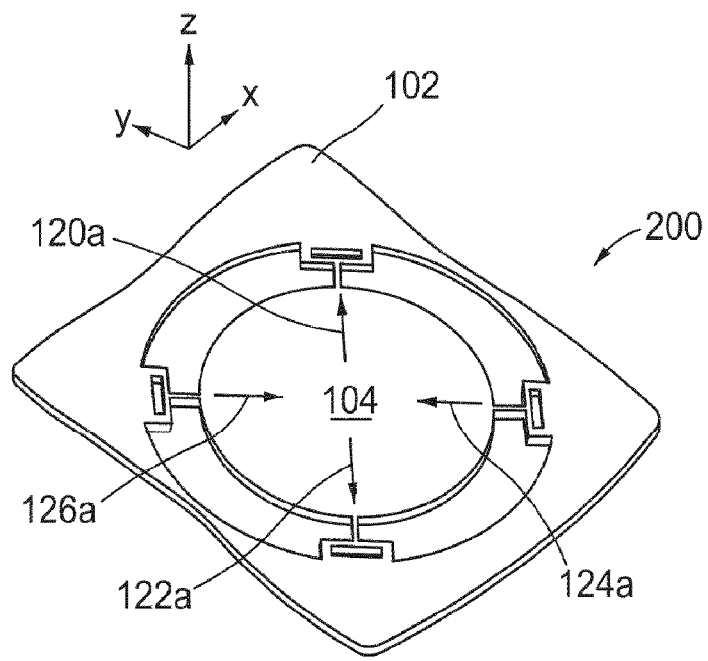
FIG. 2A is a perspective view of a gyroscope operating in the secondary elliptical mode according to an embodiment in the first configuration.
Figure 2B:
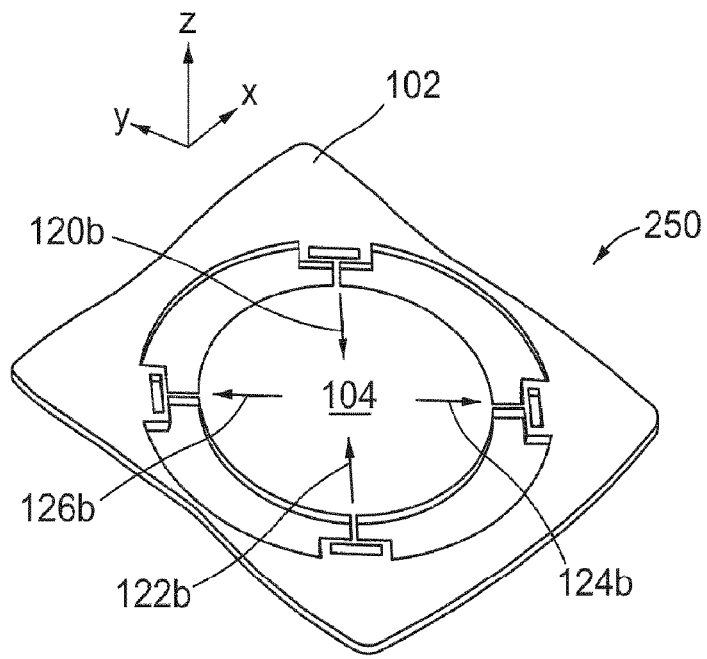
FIG. 2B is a perspective view of the gyroscope shown in FIG. 2A in the second configuration.

FIG. 2A is a perspective view showing disk structure 100 of a gyroscope according to an embodiment in the first configuration, and FIG. 2B is a perspective view showing disk structure 100 in the second configuration. FIGS. 2A and 2B show disk structure operating in a secondary elliptical mode, which is 45 degrees apart spatially from the primary elliptical mode in FIG. 1A. The arrows 120a, 122a, 124a and 126a illustrate the disk motion. On the second half cycle of the motion the disk contracts and expands according to the arrows 120b, 122b, 124b and 126b, illustrated in FIG. 2B. The secondary elliptical mode can be the secondary vibration mode. The primary elliptical mode depicted in FIGS. 1A and 1B and the secondary elliptical mode depicted in FIGS. 2A and 2B, when taken together, can form a degenerate pair of modes of approximately equal frequency with the mode shapes rotated with respect to each other. However, if the crystalline materials are employed, anisotropy of the acoustic medium can produce slight differences in both frequency and mode shape. The fabrication tolerances can also produce slight differences in both frequency and mode shape. Despite any frequency and mode shape variations, the pair of modes may be still be considered degenerate.

Note that references to a "primary" mode and a "secondary" mode refer to different directions of a common order mode. For example, the primary elliptical mode and the secondary elliptical mode refer to a first direction and a second direction, respectively, of the (2,1) mode associated with a disk structure. Similarly, other references below to a primary flexure mode and a secondary flexure mode refer to a first direction and second direction, respectively, the (2,1) mode associated with a ring structure.

Figure 3A:
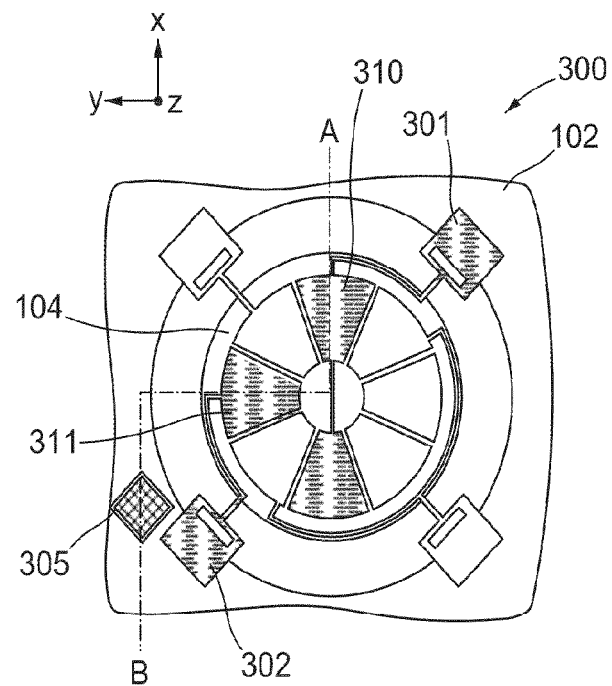
FIG. 3A is a top view of, top electrodes on a piezoelectric thin film to excite and/or sense the mode illustrated in FIGS. 1A and B)
Figure 4A:
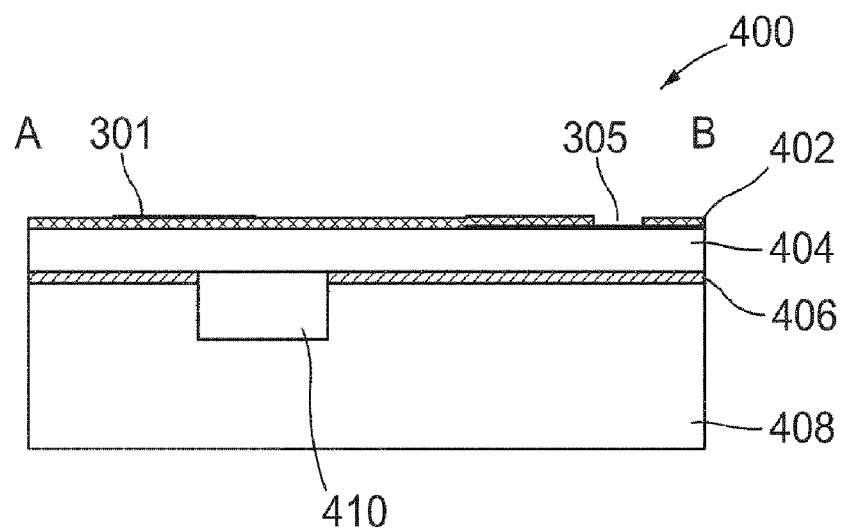
FIG. 4A is a cross-section of the structure shown in the FIG. 3A, and, FIG. 4B is a cross-section of the structure shown in the FIG. 3B.

FIG. 3A is a top view, and FIG. 4A is a cross-section view, of one embodiment of excitation of disk structure 100 using the primary elliptical mode show in FIGS. 1A and 1B. The proposed resonant structure uses a piezoelectric thin film 402 on top of another layer 404, where this layer 404 can be composed of one or more layers, and can include a temperature compensated stack, for example of the type described with respect to temperature compensated resonating structures in U.S. patent application Ser. No. 12/639,161, filed on Dec. 16, 2009 and entitled "Mechanical Resonating Structures Including a Temperature Compensation Structure" which is hereby incorporated herein by reference in its entirety, or be of a single material and can include a second piezoelectric layer. The piezoelectric thin film 402, is deposited on top of a conductive layer that is connected to the pad 305. In some embodiments the surface, portions of or the entire layer 404 can be conductive and can be used instead of this additional conductive layer.

The disk structure is suspended mechanically from the substrate 408 by using either a cavity 410 below the device, performing a backside etch, using a sacrificial layer or using a front-side under-etch of the disk 404.

By applying a voltage between the respective electrodes 310 and 311 and the bottom electrode 305, the piezoelectric layer contracts or expands based on the inverse piezoelectric effect.

In the preferred embodiment the bottom electrode 305 will be connected to ground. Applying for example a positive voltage to the top electrode 310 via the pad 301 and a negative voltage on the other top electrode 311 via pad 302, the piezoelectric layer 402 contracts and expands accordingly. As this film is clamped on the layer 404 the contraction causes the disk to contract and expand. As a result this actuation causes the motion illustrated in FIGS. 1A and 1B.

Figure 3B:
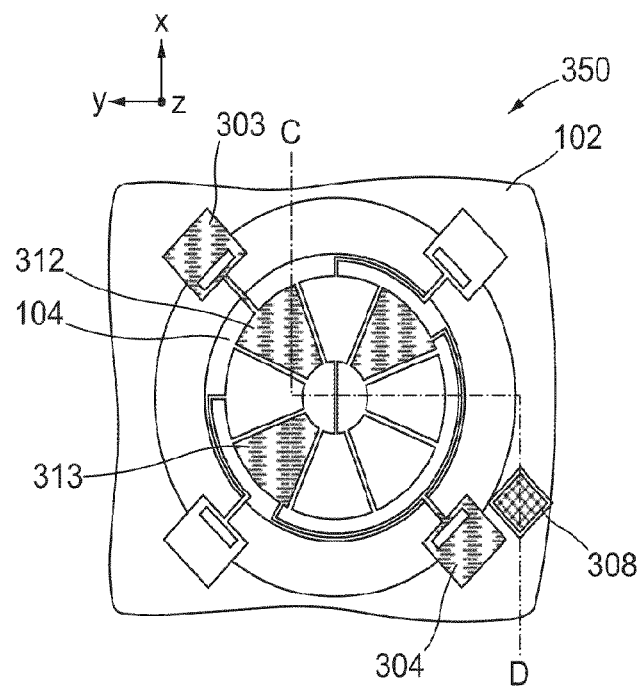
FIG. 3B is a top view of top electrodes on a piezoelectric thin film to excite and/or sense the mode illustrated in FIGS. 2A and B).
Figure 4B:
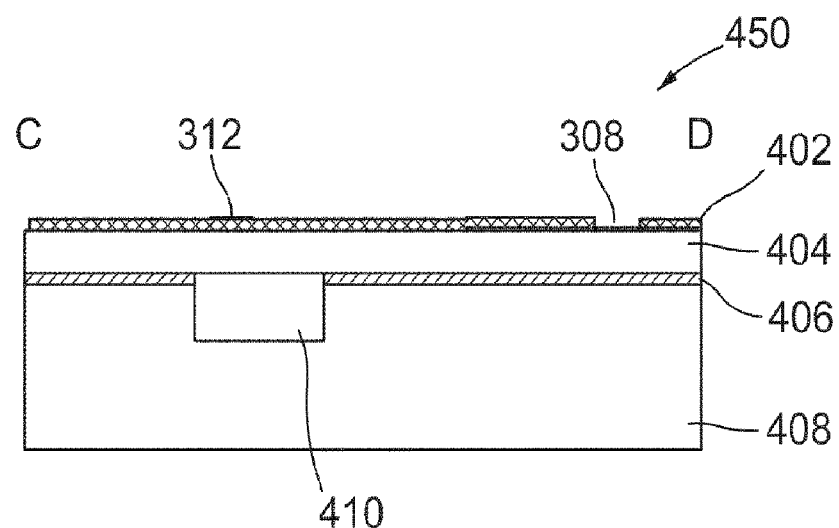

FIG. 3B is a top view, and FIG. 4B is a cross-section view, of an embodiment of excitation of disk structure 100 using the secondary elliptical mode show in FIGS. 2A and 2B. In FIG. 3B the top electrodes 312 and 313 are can be substantially similar to the those discussed in regards to FIG. 3A. In this embodiment, a bottom electrode 308 is connected to ground. By applying a positive voltage to the top electrode 312 via the pad 303 and a negative voltage to electrode 313 via the pad 304, the piezoelectric layer contracts and expands accordingly and the underlying layer 404 clamped to the piezoelectric layer contracts and expands at the same time. The resulting motion therefore resembles the motion described in FIGS. 2A and 2B.

Figure 5A:
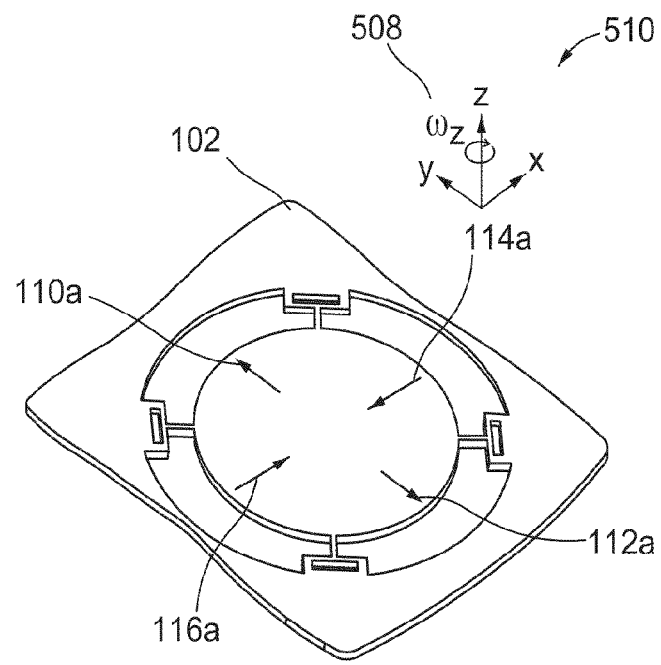
FIGS. 5A-D illustrates the sequence of the operation of a gyroscope operating in the primary elliptical mode as the exciting mode.
Figure 5B:
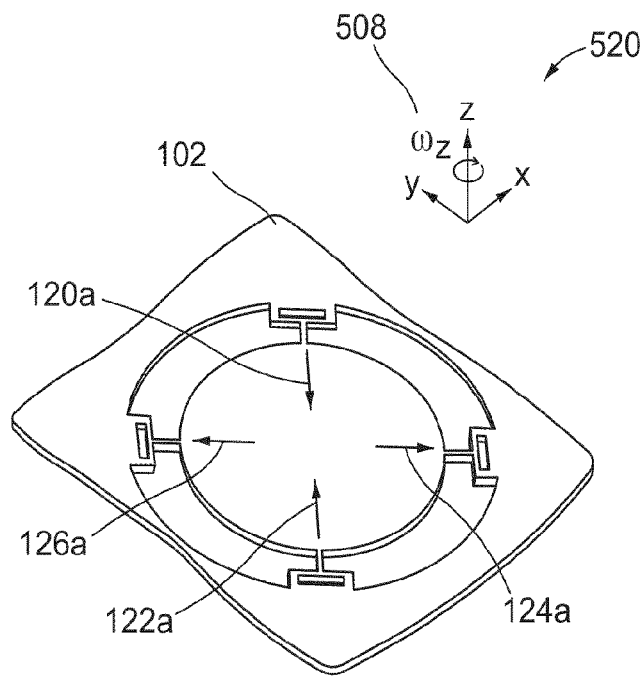

FIG. 5A through D describe the sequence of using the primary elliptical mode and the secondary elliptical mode s illustrated in FIGS. 1A and 1B and FIGS. 2A and 2B, respectively, for a gyroscope. Assume the structure 100 in FIG. 1A and angular rate $\omega_z$ 508 about the z-axis. The primary elliptical mode is shown in FIG. 5A by the arrows 110a, 112a, 114a and 116a. The Coriolis force resulting from the disk motion shown by the arrows in FIG. 5A and the angular rotation $\omega_z$ 508, transfers energy between the primary elliptical mode in FIG. 5A to the secondary elliptical mode in FIG. 5B. As a result the mode in FIG. 5B is excited with the motion indicated by arrows 120a, 122a, 124a and 126a.

Figure 5C:
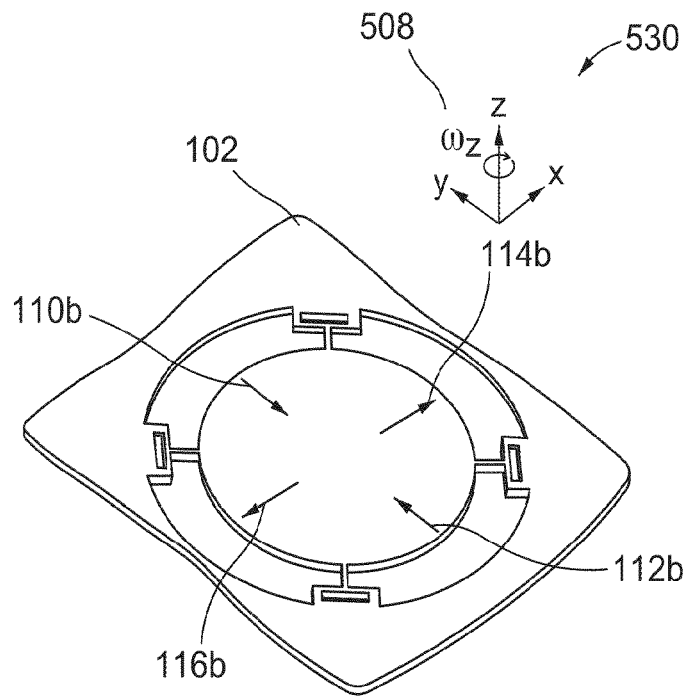

During the second half of the motion of the first elliptical mode, shown in FIG. 5C, the motion of 110a, 112a, 114a and 116a is reversed, as indicated with arrows 110b, 112b, 114b and 116b. As a result for the angular rate $\omega_z$ 508, the resulting Coriolis force transfers energy between the primary elliptical mode, shown in FIG. 5C to the secondary elliptical mode shown in FIG. 5D. As a result the mode in FIG. 5D is excited with the motion indicated by the arrows 120b, 122b, 124b and 126b.

Figure 5D:
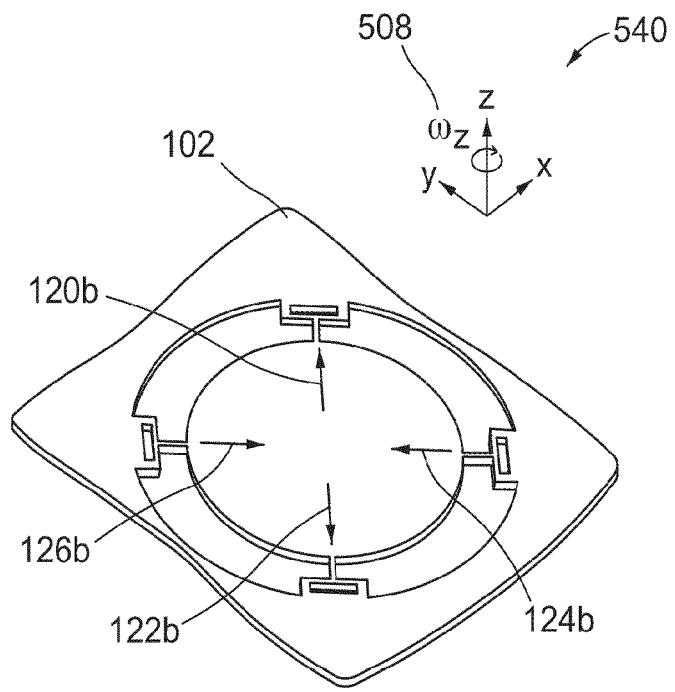

The sequence in FIG. 5A-D is intended to illustrate the relationship of how the angular rate causes the initial motion (see e.g., FIGS. 5A and 5C) to excite the second motion (see e.g., FIGS. 5B and 5D).

In principle, instead of using the initial motion to excite the secondary motion, in some embodiments, the principle can be reversed and the second motion can be used to excite the first motion. In some embodiments, whether the initial motion excites the second motion, or whether the second motion excites the initial motion can be based on the operating scheme, and whether one of these modes is operated at its resonance frequency.

Figure 6A:
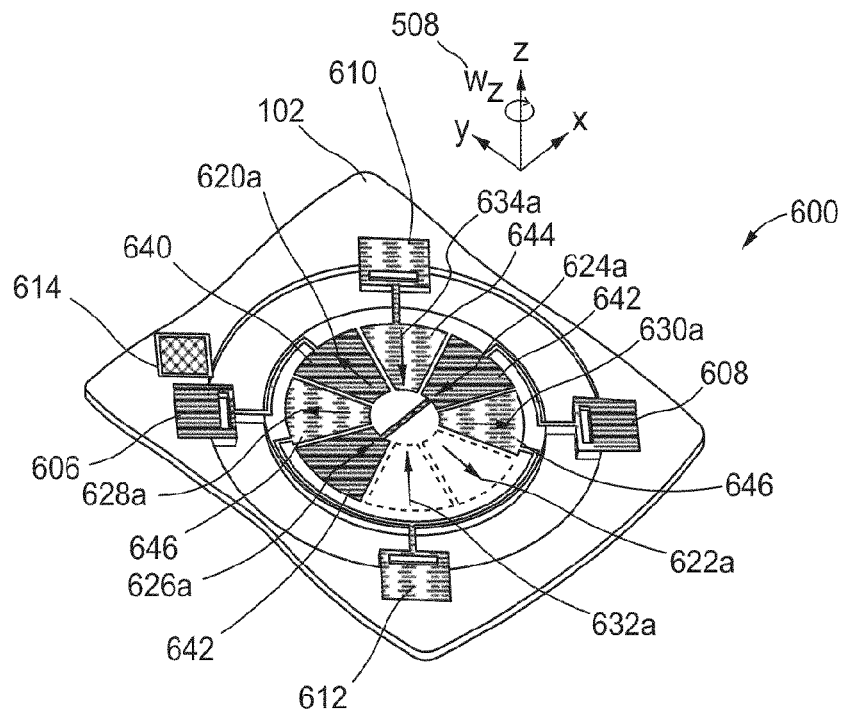
FIGS. 6A and 6B illustrate the operation of a gyroscope with actuation and sensing operating in the primary elliptical mode as the exciting mode.
Figure 6B:
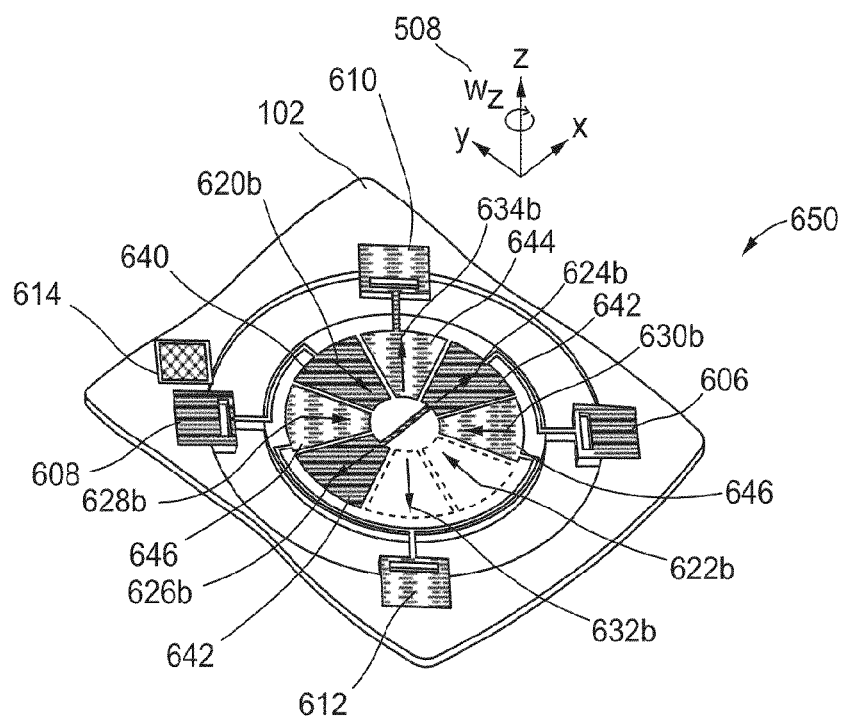

As shown and described with reference to FIGS. 3A, 3B, 4A, and 4B, a piezoelectric thin film can be used to excite the primary and/or secondary elliptical modes using the inverse piezoelectric effect. Both structures can also be operated as a sensor to sense the existence of these respective modes using the direct piezoelectric effect. To use the illustrated principle of excitation and sensing of the two modes illustrated in FIG. 5A-D, the electrode configurations of FIG. 3A and FIG. 3B are combined, e.g. combine a disk structure operating in the primary elliptical mode is combined with a disk structure operating in the secondary elliptical mode, to obtain a new disk structure 600 illustrated in FIG. 6A, B. We will assume that the primary elliptical mode motion is the driven motion, indicated by the arrows 620a, 622a, 624a and 626a. This motion is excited via the inverse piezoelectric effect and the application of an alternating voltage to the pads 606 and 608 connected to the electrodes 640 and 642. The other parts of the disk are covered by the electrodes 644 and 646 that are used in this case to sense the secondary elliptical motion.

For the case of no angular rate, i.e. $\omega_z$ 508 being zero, no Coriolis force exists. In this case the disk is excited in the primary elliptical mode. This motion does not create any net signal on the secondary elliptical mode electrodes 644 and 646, because the electrodes 644 and 646 are located on the nodal lines of the primary mode. As a result for the angular rate $\omega_z$ 508 being zero no voltage or current can be detected between the output pads 610 and 612 and the ground pad 614.

In reality small asymmetries during the fabrication or cross-talk induces a small signal in the output electrode despite the angular rate being zero. However, the amplitude of this unwanted signal may not depend on the Coriolis force and as a result can easily dealt with by the circuit or by signal processing.

In case of a non-zero angular rate $\omega_z$ 508, the Coriolis force in combination with the actively driven primary elliptical mode will cause the energy coupling between two elliptical modes 45 degrees apart spatially, as had been shown above in FIG. 5A-D. During the first half cycle, illustrated in FIG. 6A the motion of 620a, 622a, 624a and 626a together with a non-zero angular rate $\omega_z$ 508 can cause a motion of the disk along 628a, 630a, 632a and 634a. During the second half-cycle the direction 620b, 622b, 624b and 626b of the primary elliptical mode is reversed and as a result the disk through the Coriolis force experiences the reversed motion according to 628b, 630b, 632b and 634b. The second elliptical motion can piezoelectrically induce charges on the electrodes 644 and 646. As a result of the angular rate $\omega_z$ 508 being non-zero a voltage or current can be detected between the output pads 610 and 612 and the ground pad 614.

The drive and sense of the disk-gyro structure can be done differentially, for example as described with respect to differentially driven and sensed structures in U.S. patent application Ser. No. 12/639,260, filed Dec. 16, 2009, and entitled "Multi-port Mechanical Resonating Devices and Related Methods" which is hereby incorporated herein by reference in its entirety. For example to drive the primary elliptical mode differentially in FIG. 6A a positive and negative voltage can be applied on the electrodes 640 and 642 accordingly. In the presence of an angular rate $\omega_z$ 508, the Coriolis force excites the second elliptical mode and the motion of this mode induces negative and positive charges on the electrodes 644 and 646. This motion can be detected differentially. Also, the drive and sense can be done differentially if the second elliptical mode is used to drive the disk and the first elliptical mode is used to sense the Coriolis acceleration.

The layout of the electrodes 640, 642, 644 and 646 can relate to exciting one mode and at the same time detect the second mode excited through the angular rate and the Coriolis force, without creating cross-talk between these two modes. To reduce cross-talk, or increase the amplitude of the sense electrode and prevent any asymmetric motion of the plate, the electrode geometries 640, 642, 644 and 646 can be optimized.

Figure 7A:
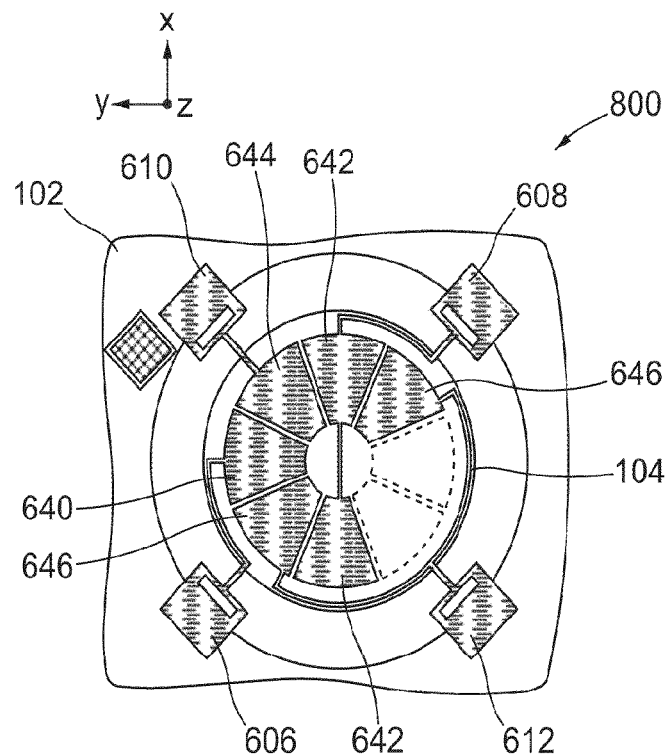
FIG. 7A illustrates a gyroscope according to another embodiment of the present invention.
Figure 7B:
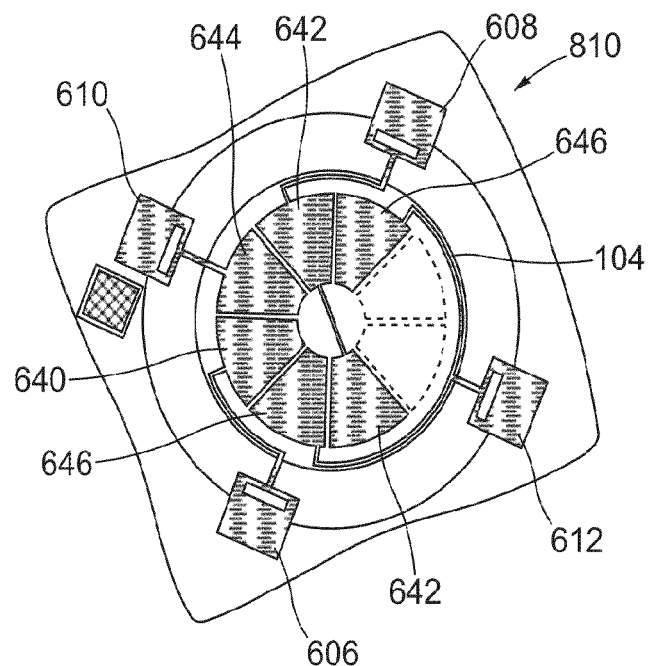
FIGS. 7B and 7C illustrate the gyroscope shown in FIG. 7A where the disk structure or the electrode geometries are rotated with respect to the crystalline direction configured to match the frequencies of the drive and sense modes of the gyroscope.
Figure 7C:
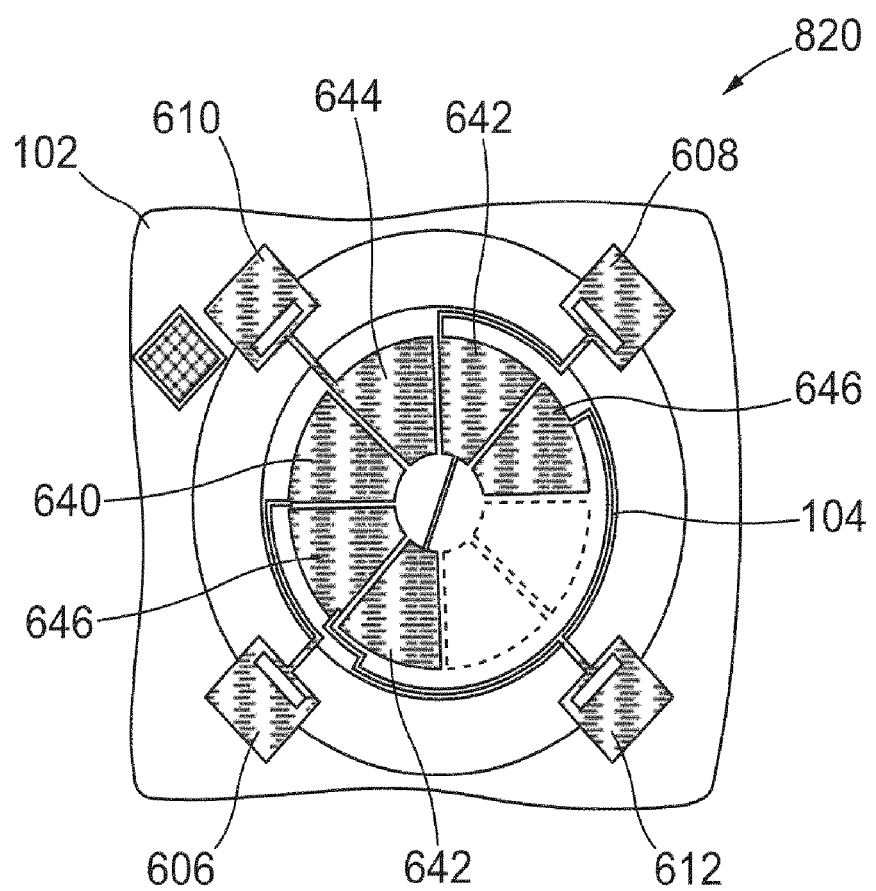

Electrode configuration is not limited to FIG. 7A. Any of electrodes 640, 642 and 648 or different combinations of them can be used for exciting the first elliptical mode. Any of electrodes 644, 646 and 650 or different combinations of them can be used to sense the second elliptical mode. By substantially matching the resonance frequency of the drive and sense modes, the sensitivity of the gyro device is amplified by the quality factor of the structure. The frequency of modes depends on the Young's modulus, which depends on the crystal orientation of the material. Because the piezoelectric material and other materials in the stack layer in FIG. 4A,B can be anisotropic, the two elliptical modes 45 degrees apart spatially would have different natural frequencies. To substantially match the frequencies to obtain the Q amplification, the whole resonator disk structure or the electrode geometries 640, 642, 644 and 646 can be rotated with respect to the crystalline direction such that both elliptical drive and sense modes have the same frequency as illustrated in FIG. 7B and FIG. 7C respectively, in contrast to FIG. 7A.

Although the primary and secondary elliptical modes are shown and described in FIGS. 1A-7C as the (2,1) mode, higher-circumferential-order modes are possible, e.g. (3,1), (3,2), and (4,1). In this case the angle between the degenerate modes changes in a well-defined manner. To determine this angle, the rotational symmetry of the mode can be determined, and is the circumferential mode order m of the mode. For the primary elliptical mode, the symmetry is 2-fold, while the (3,1) mode has 3-fold symmetry. The angle between degenerate modes is given by 90°/m.

Figure 8A:
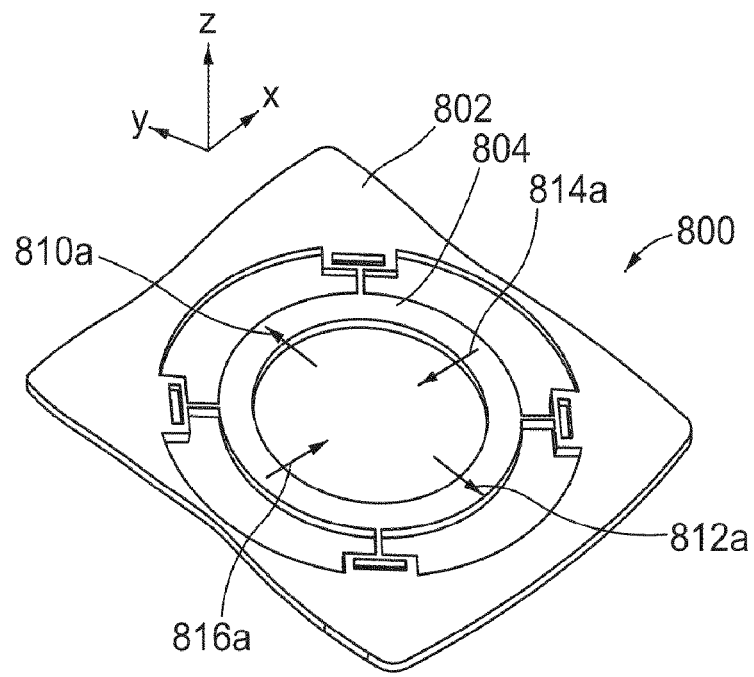
FIG. 8A is a perspective view of a gyroscope operating in the primary in-plane flexural mode according to an embodiment in the first configuration.
Figure 8B:
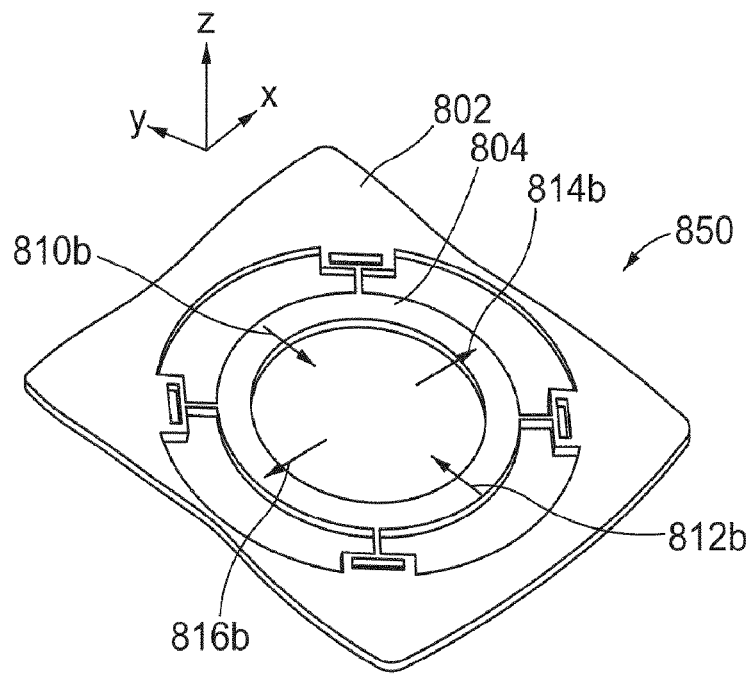
FIG. 8B is a perspective view of the gyroscope in the second configuration.

Although the gyroscopes are shown and described in FIGS. 1A-7C as including a disc 104 suspended from substrate 102, in some embodiments, other shapes can be suspended from the substrate. By way of example, in some embodiments, a ring 804 can be suspended from a substrate 802. FIG. 8A is a perspective view of a ring structure 800 in the first configuration, and FIG. 8B is a perspective view of the ring structure 800 in the second configuration. The suspended ring 804 is connected to a substrate 802, for example using anchors of the type described in above-referenced U.S. patent application Ser. No. 12/732,575, or any other suitable anchors. One possible mechanical vibration mode of this structure is a primary flexural mode, indicated by the arrows 810a, 812a, 814a and 816a. This mode has elliptical shape. The vibration of the ring for the other half cycle is illustrated in FIG. 8B. The arrows indicate the flexure of the ring according to the arrows 810b, 812b, 814b and 816b. This flexural mode is also referred to as the primary flexural mode or the (2,1) mode (the first radial harmonic of circumferential mode order 2).

Figure 9A:
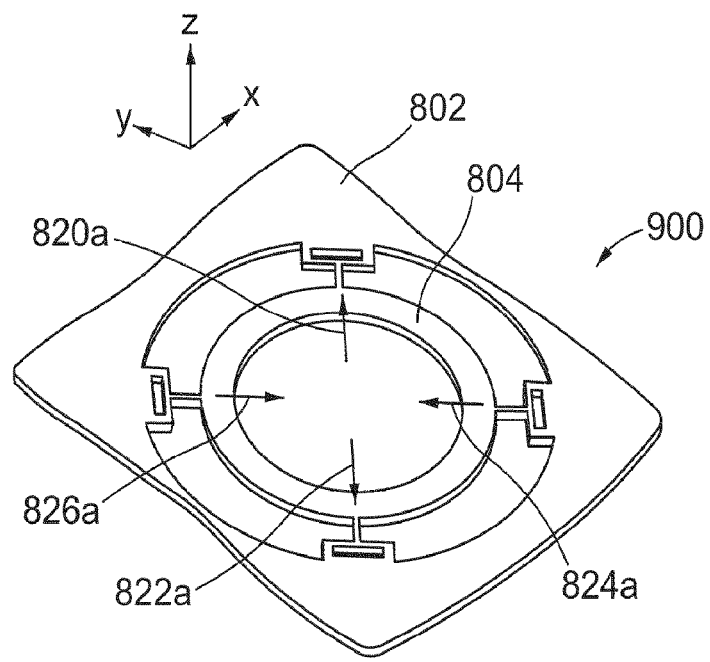
FIG. 9A is a perspective view of a gyroscope operating in the secondary flexural mode according to an embodiment in the first configuration.
Figure 9B:
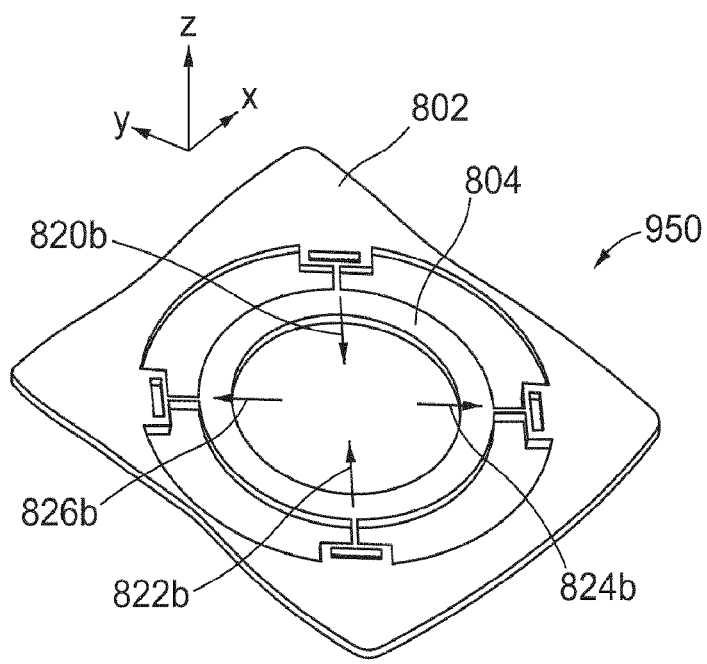
FIG. 9B is a perspective view of the gyroscope in the second configuration.

The secondary flexural mode which is 45 degrees apart spatially from the primary mode in FIG. 8A, is illustrated in FIG. 9A. The arrows 820a, 822a, 824a, and 826a illustrate the ring motion. On the second half cycle of the motion the ring flexes according to the arrows 820b, 822b, 824b, and 826b, illustrated in FIG. 9B. The primary flexural mode depicted in FIGS. 8A and 8B and the secondary flexural mode depicted in FIGS. 9A and 9B, when taken together, can form a degenerate pair of modes of approximately equal frequency with the mode shapes rotated with respect to each other. However, if crystalline materials are employed, anisotropy of the acoustic medium will produce slight differences in both frequency and mode shape.

Figure 10A:
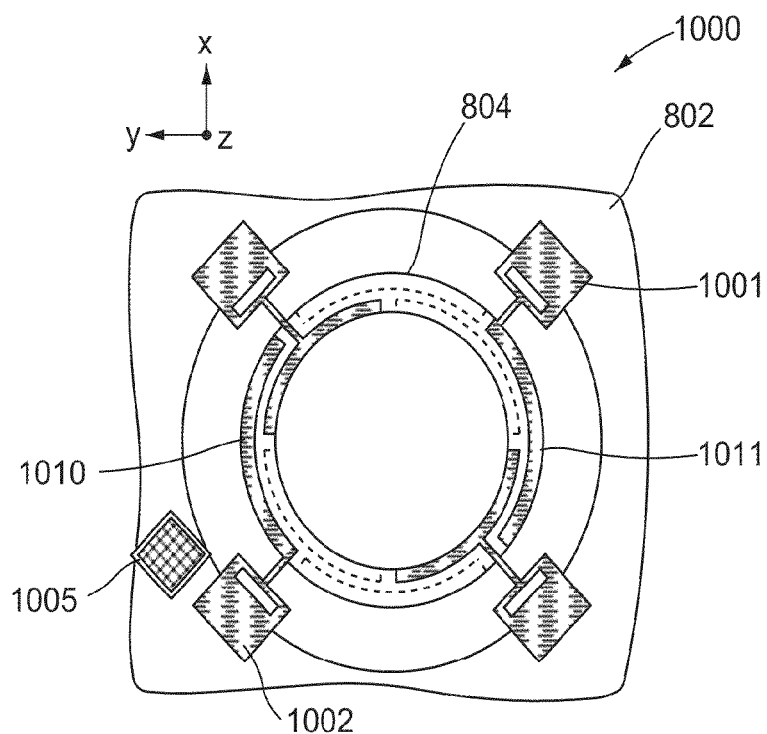
FIG. 10A is a top view of top electrodes on a piezoelectric thin film to excite and/or sense the modes illustrated in FIGS. 8A and 8B.

FIG. 10A is a top view of an embodiment of how the in-plane flexural primary modes illustrated in FIGS. 8A and B can be excited. The structures of FIGS. 10A and 10B can have the same cross-section as previously shown and described in connection with FIG. 4A, having the same reference numbers. The proposed structure uses a piezoelectric thin film 402 on top of another layer 404, where this layer 404 can be composed of one or more layers, and can include a temperature compensated stack, for example of the type described with respect to temperature compensated resonating structures in U.S. patent application Ser. No. 12/639,161, filed on Dec. 16, 2009 and entitled "Mechanical Resonating Structures Including a Temperature Compensation Structure" which is hereby incorporated herein by reference in its entirety, or be of a single material and can include a second piezoelectric layer. The piezoelectric thin film 402 is deposited on top of a conductive layer that is connected to the pad 1005. In some embodiments the surface, portions of or the entire layer 404 can be conductive and can be used instead of this additional conductive layer.

The ring structure is suspended mechanically from the substrate 408 by using either a cavity below the device 410, performing a backside etch, using a sacrificial layer or using a front-side under-etch of the ring 804.

By applying a voltage between the respective electrodes 1010 and 1011 and the bottom electrode 1005, the piezoelectric layer can contract or expand based on the inverse piezoelectric effect.

In one embodiment the bottom electrode 1005 will be connected to ground. Applying for example a negative voltage to the top electrode 1010 via the pad 1002, the piezoelectric layer 402 can expand. As this film is clamped on the layer 404 the expansion can cause the ring to flex outward in the y-direction. Applying a negative voltage on the other top electrode 1011 can cause the other side of the ring to flex outward in the y-direction. As a result this actuation can cause the motion illustrated in FIGS. 8A and B.

Figure 10B:
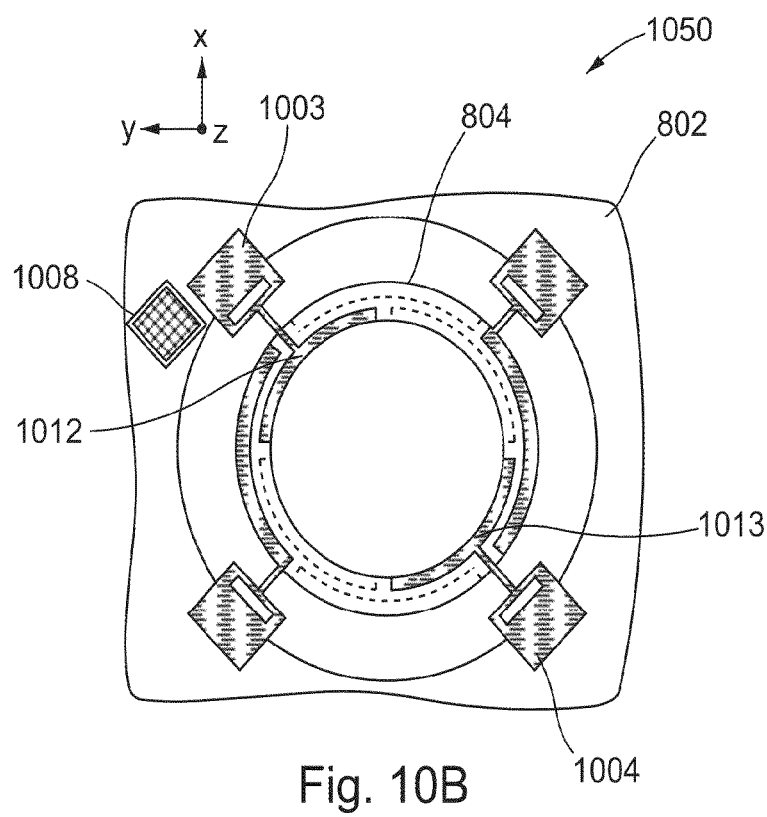
FIG. 10B is a top view of top electrodes on a piezoelectric thin film to excite and/or sense the modes illustrated in FIGS. 9A and 9B.

In FIG. 10B the top electrodes 1012 and 1013 can be similar to those discussed in regards to FIG. 10A. For the one embodiment bottom electrode 1008 is connected to ground. By applying a positive voltage to the top electrode 1012 and 1013 via the pads 1003 and 1004, the piezoelectric layer can contract and the underlying layer 404 clamped to the piezoelectric layer can contract at the same time. The resulting motion therefore resembles the motion described in FIG. 9A,B.

Figure 11A:
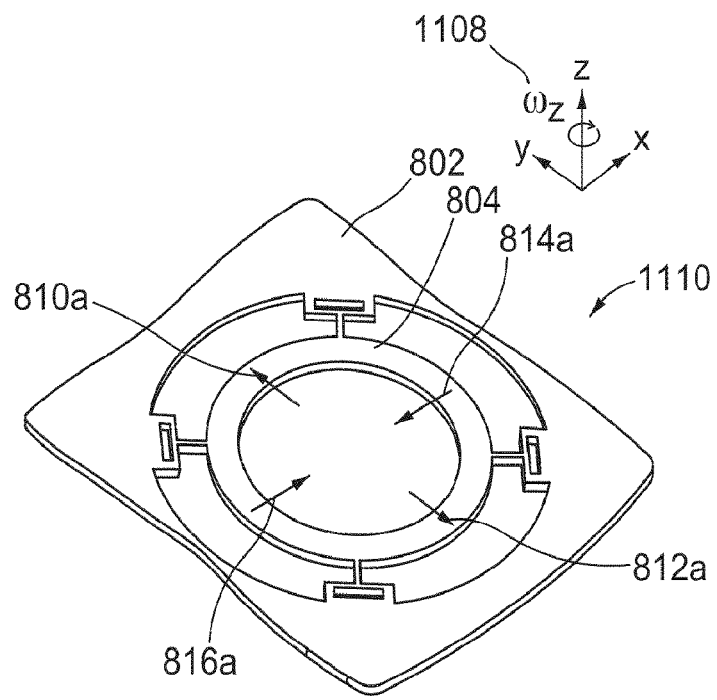
FIGS. 11A-D illustrate the sequence of the operation of a gyroscope operating in the first in-plane flexural mode as the exciting mode.
Figure 11B:
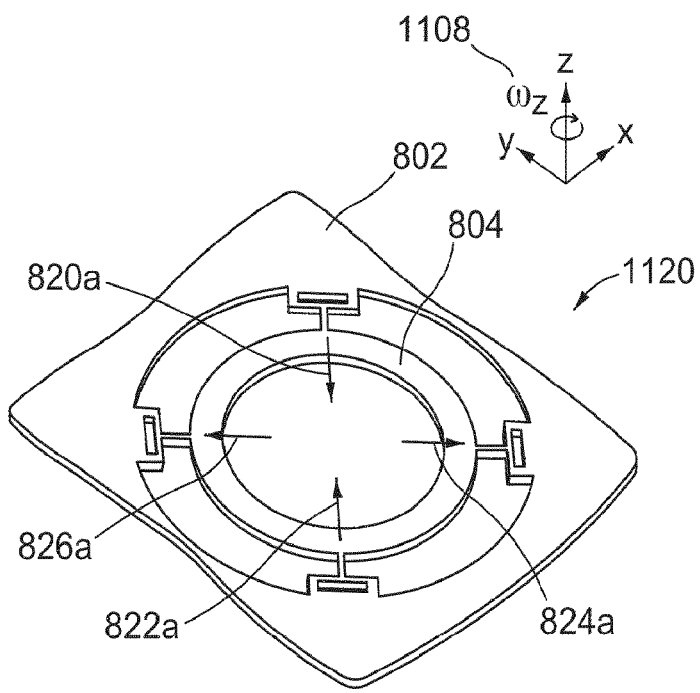

FIG. 11A through D show gyroscopes using the two modes illustrated in FIGS. 8A and B and FIGS. 9A and B. FIG. 8A shows structure 800 and an angular rate $\omega_z$ 1108 about the z-axis. The primary mode is shown by the arrows 810a, 812a, 814a and 816a in FIG. 11A. The Coriolis force resulting from the ring motion illustrated in FIG. 11A and the angular rotation $\omega_z$ 1108, transfers energy between the primary flexural mode in FIG. 11A to the secondary mode in FIG. 11B. As a result the secondary flexural mode in FIG. 11B is excited with the motion 820a, 822a, 824a and 826a.

Figure 11C:
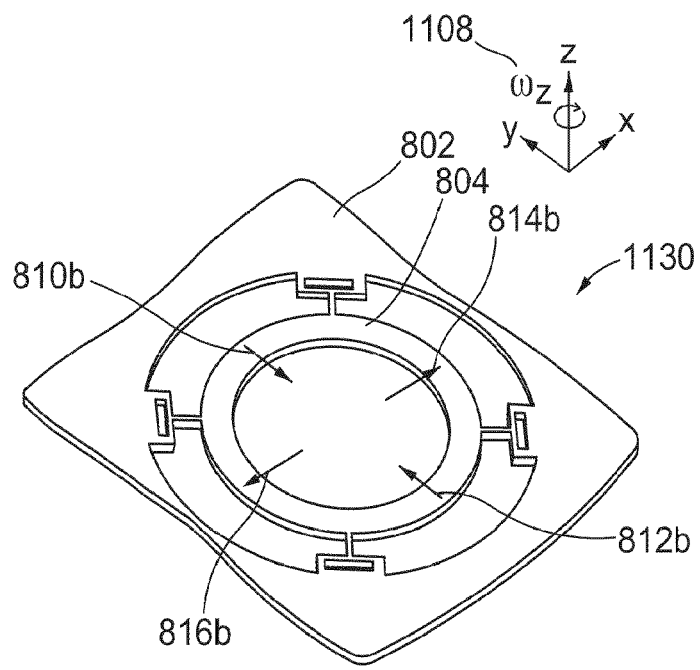
Figure 11D:
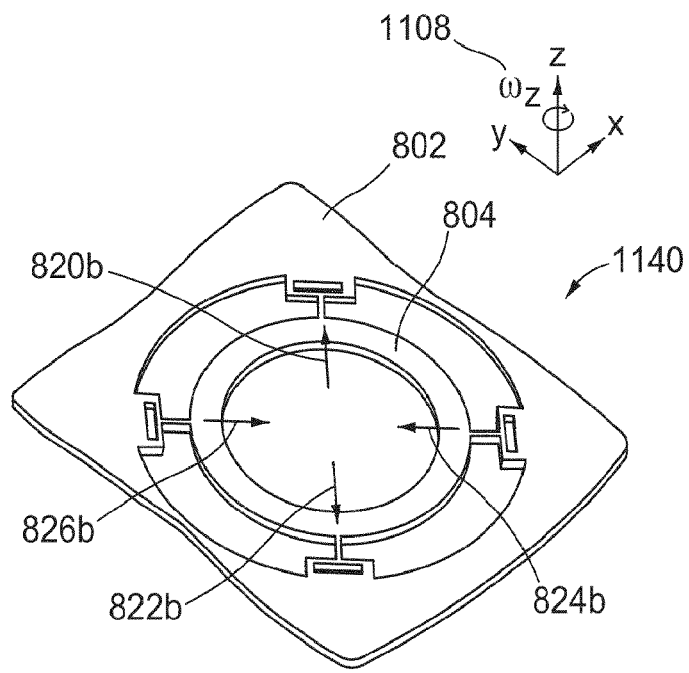

During the second half cycle of the motion of the primary flexural motion of FIG. 11A, shown in FIG. 11C, the motion of 810a, 812a, 814a and 816a is reversed, as indicated with arrows 810b, 812b, 814b and 816b. As a result of the angular rate $\omega_z$ 1108, the resulting Coriolis acceleration causes the mode coupling between the primary flexural mode in FIG. 11C to the secondary flexural mode illustrated in FIG. 11D. As a result the secondary flexural mode in FIG. 11D is excited with the motion 820b, 822b, 824b and 826b.

The sequence in FIG. 11A-D is intended to illustrate the relationship of how the angular rate causes the initial flexural motion (FIG. 11A, C) to excite the second flexural motion (FIG. 11B, D).

Instead of using the initial motion to excite the secondary motion, the secondary motion can be used to excite the initial motion. In some embodiments, whether the initial motion excites the second motion, or whether the second motion excites the initial motion can be based on the operating scheme, and whether one of these modes is operated at its resonance frequency.

Figure 12A:
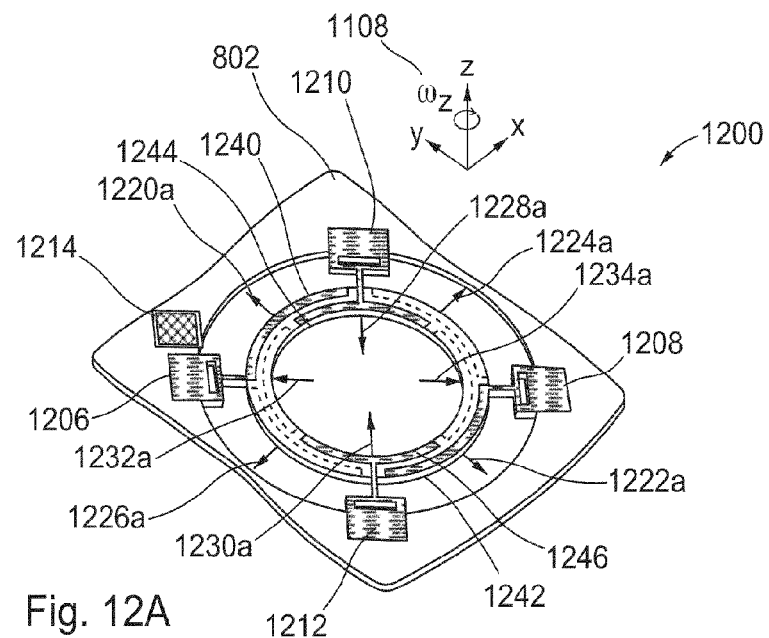
FIGS. 12A and 12B illustrate the operation of a gyroscope with actuation and sensing operating in the first in-plane flexural mode as the exciting mode.
Figure 12B:
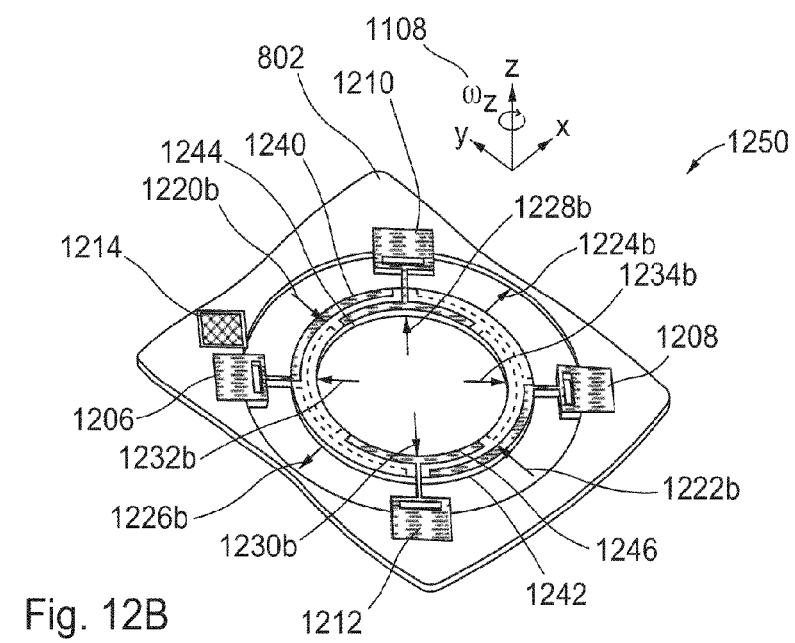

As shown and described with reference to FIGS. 10A and B, a piezoelectric thin film can be used to excite the primary and/or secondary flexural modes using the inverse piezoelectric effect. Both structures can also be operated as a sensor to sense the existence of these respective modes using the direct piezoelectric effect. To use the illustrated principle of excitation and sensing of the two modes illustrated in FIG. 11A-D, we now combine the electrode configurations of FIG. 10A and FIG. 10B can be combined, e.g., combine the ring structure operating in the primary flexural mode with the ring structure operating in the secondary flexural mode to obtain a new ring structure 1200 illustrated in FIG. 12A, B. Assume the primary mode motion can be the driven motion, indicated by the arrows 1220a, 1222a, 1224a and 1226a. This motion can be excited via the inverse piezoelectric effect and the application of an alternating voltage to the pads 1206 and 1208 connected to the electrodes 1240 and 1242. The other parts of the ring are covered by the electrodes 1244 and 1246 that are used in this case to sense the secondary mode motion.

For the case of no angular rate, i.e. $\omega_z$ 1108 being zero, no Coriolis force exists. In this case the ring can be excited in the primary mode. This motion may not create any net signal on the secondary mode electrodes 1244 and 1246, because the electrodes 1244 and 1246 are located on the nodal lines of the primary mode. As a result for the angular rate $\omega_z$ 1108 being zero no voltage or current may be detected between the output pads 1210 and 1212 and the ground pad 1214.

In reality, small asymmetries during the fabrication or cross-talk can induce a small signal in the output electrode despite the angular rate being zero. However, the amplitude of this unwanted signal does not depend on the Coriolis force and as a result can be easily dealt with by the circuit or by signal processing.

In case of a non-zero angular rate $\omega_z$ 1108 the Coriolis force in combination with the actively driven primary mode can cause the energy coupling between two primary and secondary modes, as had been shown above in FIG. 11A-D. During the first half cycle, illustrated in FIG. 12A the motion of 1220a, 1222a, 1224a and 1226a together with a non-zero angular rate $\omega_z$ 1108 can cause a motion of the ring along 1228a, 1230a, 1232a and 1234a. During the latter half-cycle the direction 1220b, 1222b, 1224b and 1226b of the primary mode can be reversed and as a result the ring, through the Coriolis force, experiences the reversed motion according to 1228b, 1230b, 1232b and 1234b. The secondary motion piezoelectrically can induce charges on the electrodes 1244 and 1246. As a result of the angular rate $\omega_z$ 1108 being non-zero a voltage or current can be detected between the output pads 1210 and 1212 the ground pad 1214.

The layout of the electrodes 1240, 1242, 1244 and 1246 can be important to be able to excite one mode and at the same time detect the secondary mode excited through the angular rate and the Coriolis force, without creating cross-talk between these two modes. To reduce cross-talk, or increase the amplitude of the signal on the sense electrode and prevent any asymmetric motion of the plate, the electrode geometries 1240, 1242, 1244 and 1246 can be optimized.

Figure 13A:
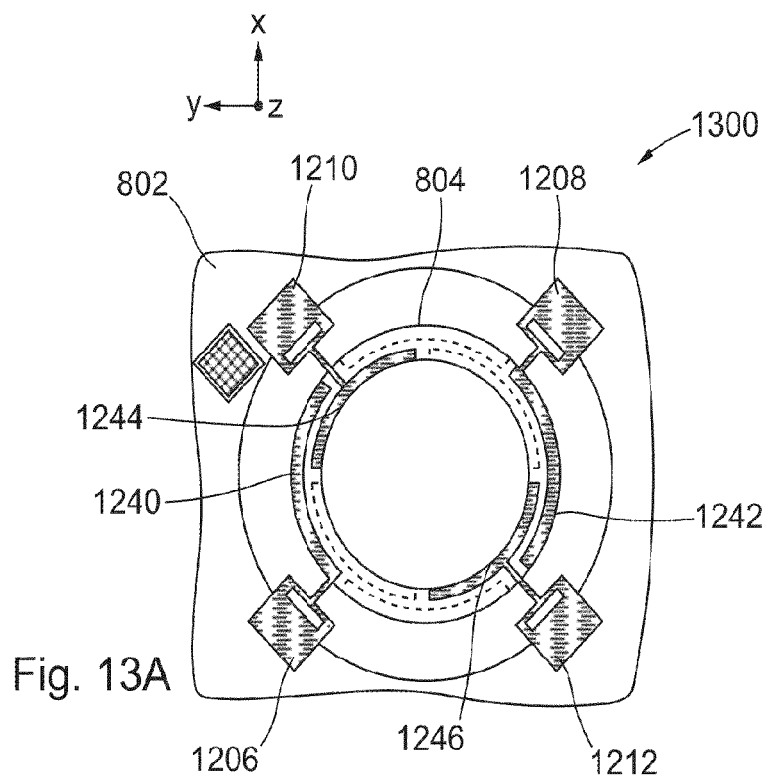
FIG. 13A shows a gyroscope according to another embodiment.
Figure 13B:
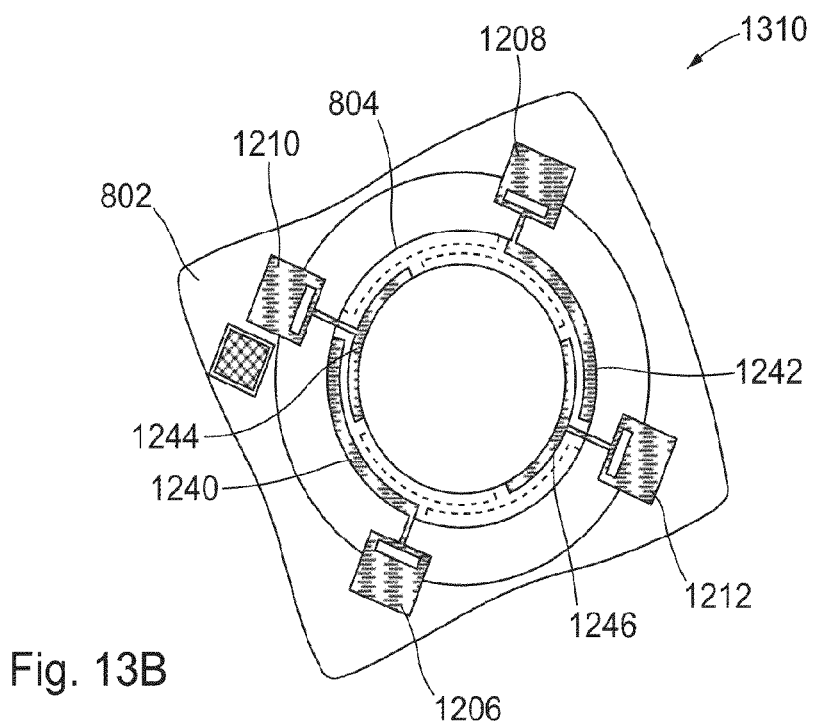
FIGS. 13B and 13C illustrate rotated geometries with respect to the crystalline direction to match the frequencies of the drive and sense modes of the gyroscope with respect to geometry shown in FIG. 13A.
Figure 13C:
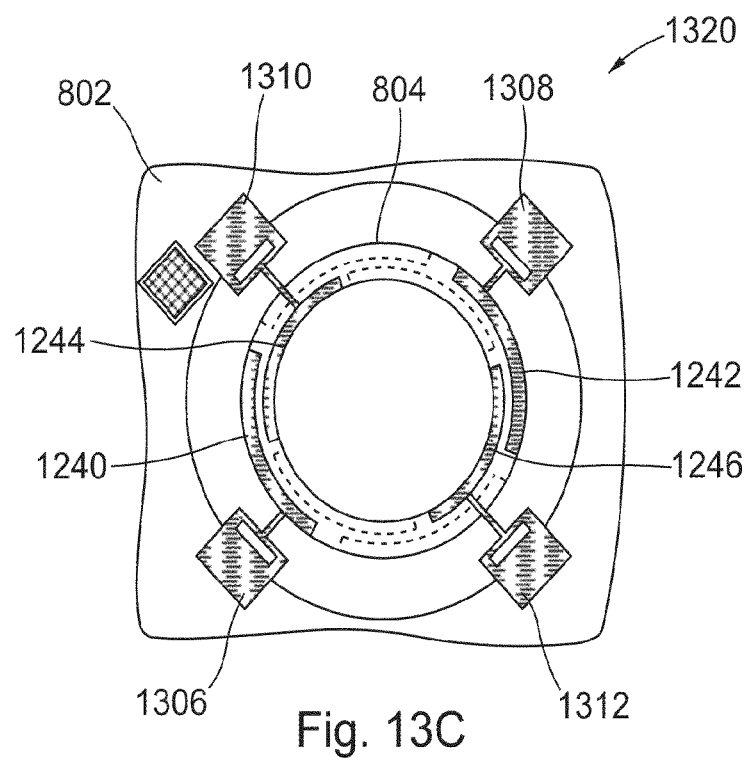

Electrode configuration is not limited to FIG. 13A. Any of electrodes 1240, 1241, 1242 and 1243 or different combinations of them can be used for exciting the primary flexural mode. Any of electrodes 1244, 1245, 1246 and 1247 or different combinations of them can be used to sense the secondary flexural mode. By substantially matching the resonance frequency of the drive and sense modes the sensitivity of the gyro device can be amplified by the quality factor of the structure. The frequency of modes can depend on the Young's modulus, which can depend on the crystal orientation of the material. Because the piezoelectric material and other materials in the stack layer in FIG. 13A can be anisotropic, the primary and secondary modes may have different natural frequencies. To substantially match the frequencies to obtain the Q amplification, the whole resonator disk structure or the electrodes geometries 1240, 1242, 1244 and 1246 can be rotated with respect to the crystalline direction such that both drive and sense modes have the same frequency as illustrated in FIG. 13B and FIG. 13C respectively in contrast to FIG. 13A.

Figure 13D:
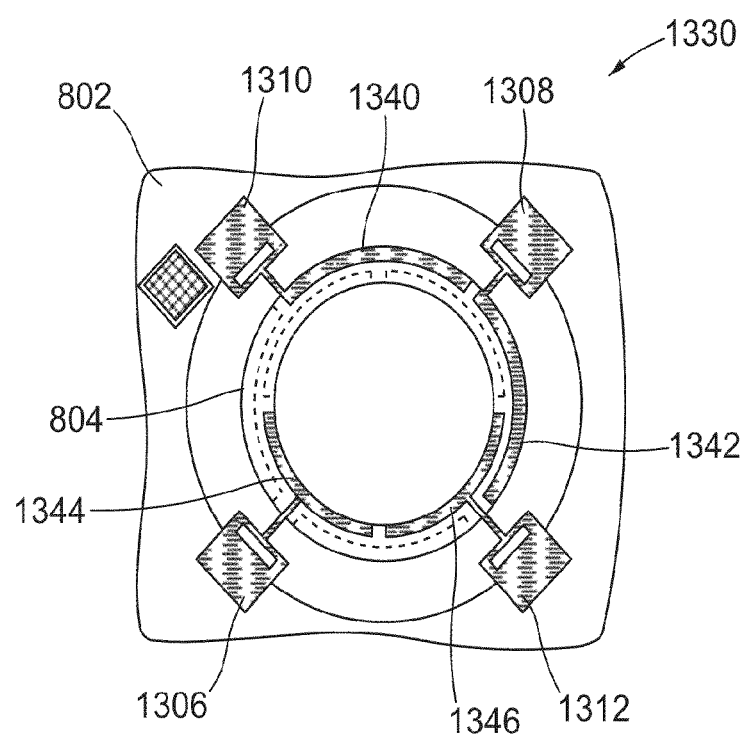
FIG. 13D shows different electrode geometries for differential drive and sense techniques for the gyroscope shown in FIG. 13A.

The drive and sense of the ring-gyro structure can be done differentially, for example as described with respect to differentially driven and sensed structures in above-referenced U.S. patent application Ser. No. 12/639,260. For example in order to drive the primary flexural mode differentially in FIG. 13D a positive and negative voltage can be applied on the electrodes 1340 and 1342. In the presence of an angular rate $\omega_z$ 1108, the Coriolis force excites the secondary mode and the motion of this mode induces negative and positive charges on the electrodes 1344 and 1346. This motion can be detected differentially. The drive and sense can be done differentially if the secondary mode is used to drive the ring and the primary mode is used to sense the Coriolis acceleration.

Although the primary and secondary flexural modes are shown and described in FIGS. 8A-13D as the (2,1) mode as described above, higher-circumferential-order modes can exist, e.g. (3,1), (3,2), and (4,1). In this case the angle between the degenerate modes changes in a well-defined manner. To determine this angle, the rotational symmetry of the mode must be determined, and is simply the circumferential mode order m of the mode. For the primary flexural mode, the symmetry is 2-fold, while the (3,1) mode has 3-fold symmetry. The angle between degenerate modes is given by 90°/m.

Figure 14A:
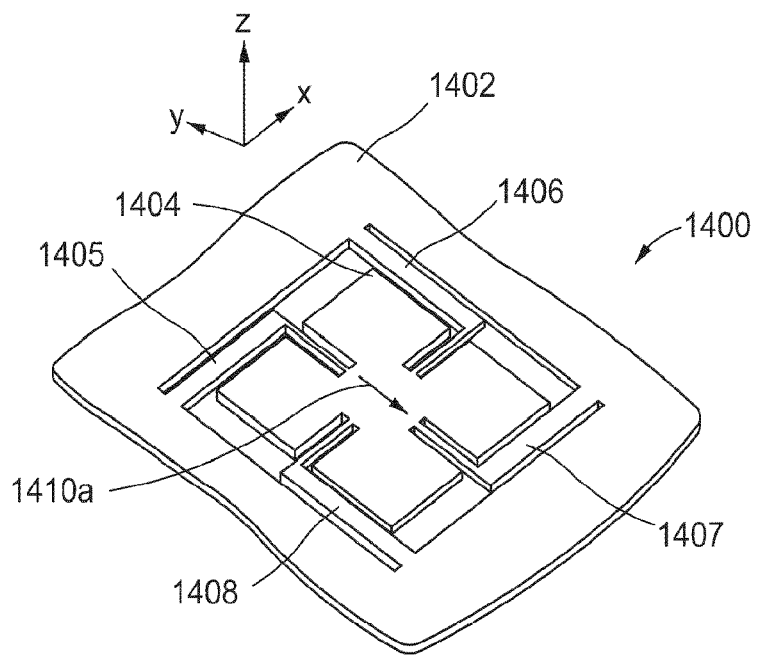
FIG. 14A is a perspective view of a gyroscope operating in the y-direction in-plane mode according to another embodiment in the first configuration.
Figure 14B:
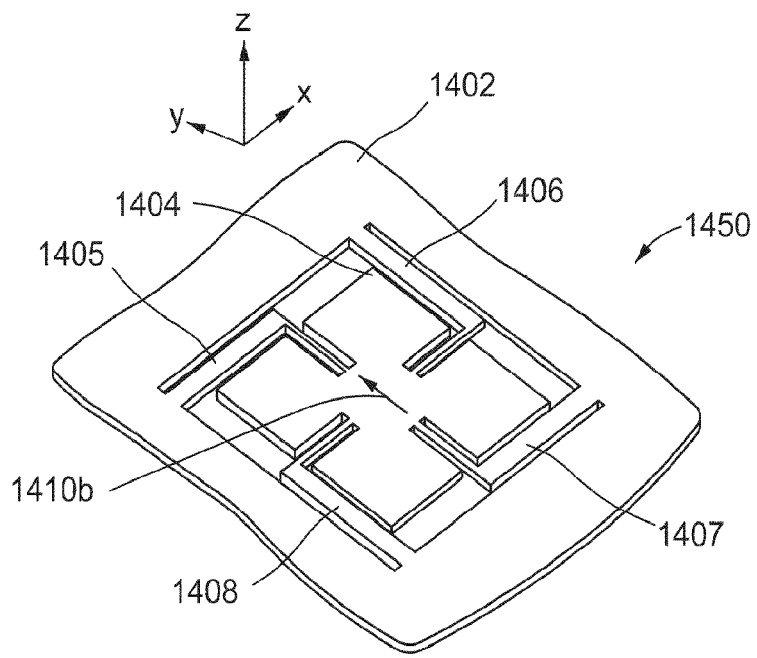
FIG. 14B shows the gyroscope of FIG. 14A in the second configuration.

According to another embodiment, a piezoelectric MEMS gyroscope utilizing a proof mass can be employed. A structure 1400 with proof mass m is shown in FIG. 14A. The suspended proof mass 1404 is connected to a substrate 1402 using four anchors 1405, 1406, 1407 and 1408. In some embodiments, more or fewer anchors can be included. Proof mass 1404 can be driven in its in-plane y-direction mode. The motion of the plate in this mode is indicated by the arrow 1410a. The vibration of the proof mass for the other half cycle is illustrated in FIG. 14B. The arrow indicates the motion of the mass according to the arrow 1410b.

Figure 15A:
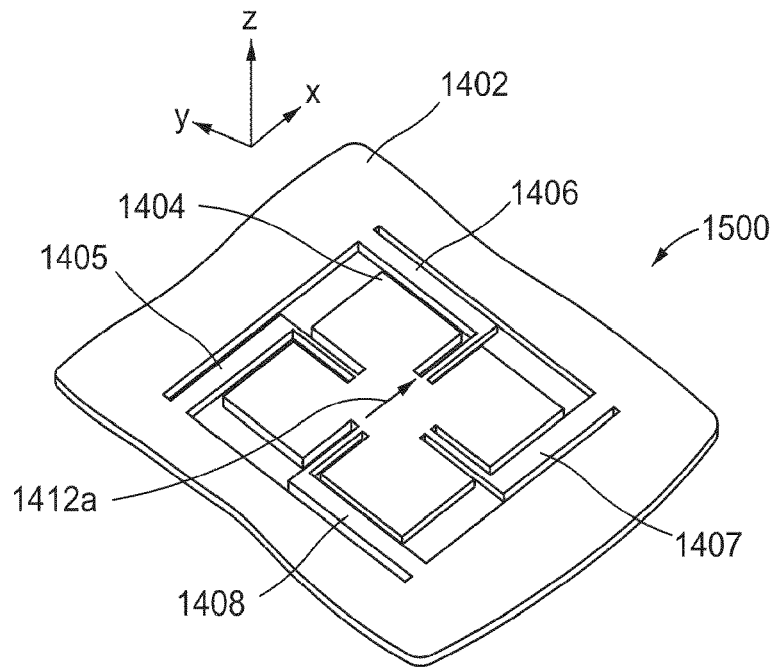
FIG. 15A is a perspective view of a gyroscope operating in the x-direction in-plane mode according to another embodiment in the first configuration.
Figure 15B:
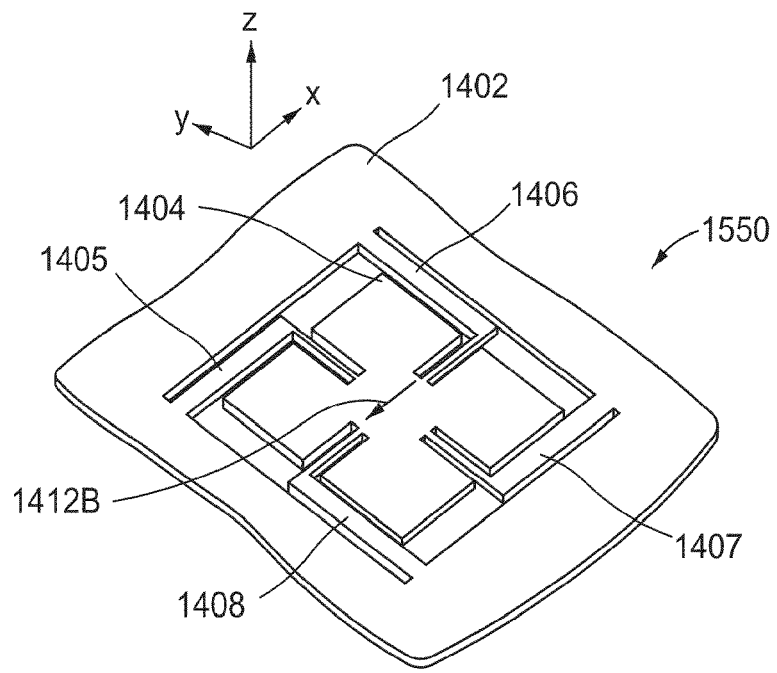
FIG. 15B is a perspective view of the gyroscope shown in FIG. 15A in the second configuration.

Another in-plane mode in the x-direction is illustrated in FIG. 15A. The arrow 1412a illustrates the mass motion. On the second half cycle of the motion the mass moves according to the arrow 1412b, illustrated in FIG. 15B.

Figure 16A:
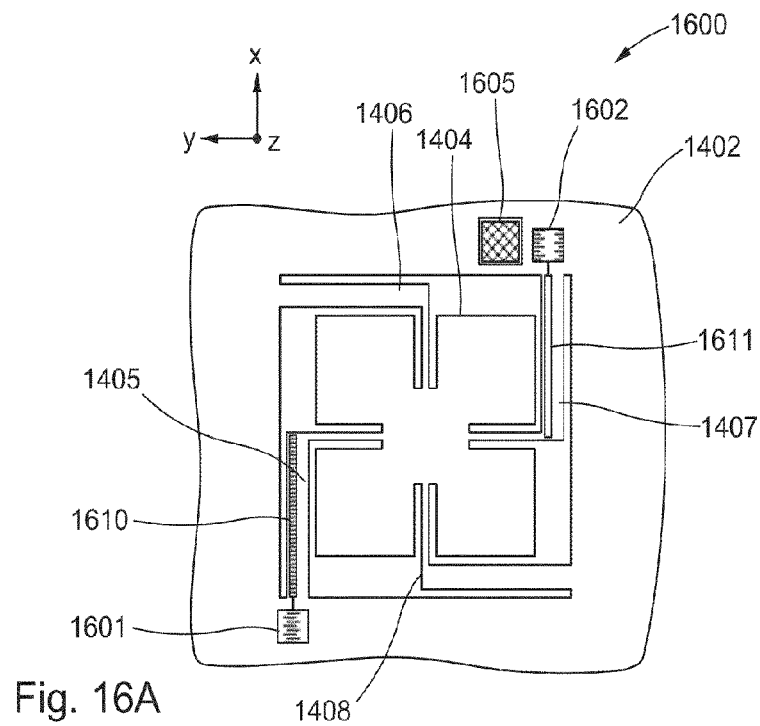
FIG. 16A is a top view of top electrodes on a piezoelectric thin film to excite and/or sense the modes illustrated in FIGS. 14A and 14B.

FIG. 16A shows the top view of one possible embodiment of how the in-plane y-direction mode illustrated in FIG.

14A, B can be excited. In order to excite the y-direction mode, the electrodes 1610 and 1611 are located on the anchors 1405 and 1407.

The structure of FIGS. 16A and 16B may have a similar cross-section as previously shown and described in connection with FIG. 4A, having the same reference numbers. The proposed structure uses a piezoelectric thin film 402 on top of another layer 404. Where this layer 404 can be composed of one or more layers, and can include a temperature compensated stack, for example of the type described with respect to temperature compensated resonating structures in U.S. patent application Ser. No. 12/639,161, filed on Dec. 16, 2009 and entitled "Mechanical Resonating Structures Including a Temperature Compensation Structure" which is hereby incorporated herein by reference in its entirety, or be of a single material and can include a second piezoelectric layer. The piezoelectric thin film can be deposited on top of a conductive layer that can be connected to the pad 1605. In some embodiments the surface, portions of or the entire layer 404 can be conductive and can be used instead of this additional conductive layer.

The structure can be suspended mechanically from the substrate 408 by using either a cavity below the device 410, performing a backside etch, and/or using a sacrificial layer or using a front-side under-etch of the proof mass 1404.

By applying a voltage between the respective electrodes 1610 and 1611 and the bottom electrode 1605, the piezoelectric layer can contract or expand based on the inverse piezoelectric effect.

In one embodiment the bottom electrode 1605 can be connected to ground. Applying for example a positive voltage to the top electrode 1610 and 1611 via the pad 1601 and 1602, the piezoelectric layer 402 can contract. As this film is clamped on the layer 404 the contraction can cause the anchors 1405 and 1407 to contract. As a result this actuation can cause the motion of the proof mass illustrated in FIGS. 14A and B.

Figure 16B:
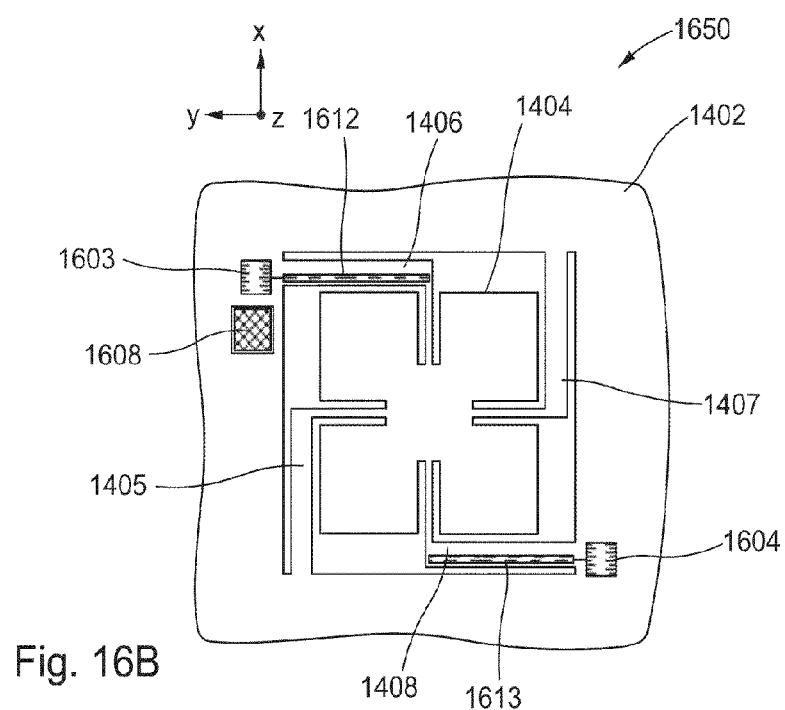
FIG. 16B is a top view of top electrodes on a piezoelectric thin film to excite and/or sense the modes illustrated in FIGS. 15A and 15B.

In FIG. 16B the top electrodes 1612 and 1613 are similar to the concept discussed in regards to FIG. 16A. They are located on the anchors 1406 and 1408. For one embodiment 1608 is connected to ground. By applying a positive voltage to the top electrode 1612 and 1613 via the pad 1603 and 1604, the piezoelectric layer can contract and the underlying layer 404 clamped to the piezoelectric layer can contract. As this film is clamped on the layer 404 the contraction can cause the anchors 1406 and 1408 to contract. As a result this actuation can cause the motion of the proof mass as illustrated in FIGS. 15A and B.

Figure 17A:
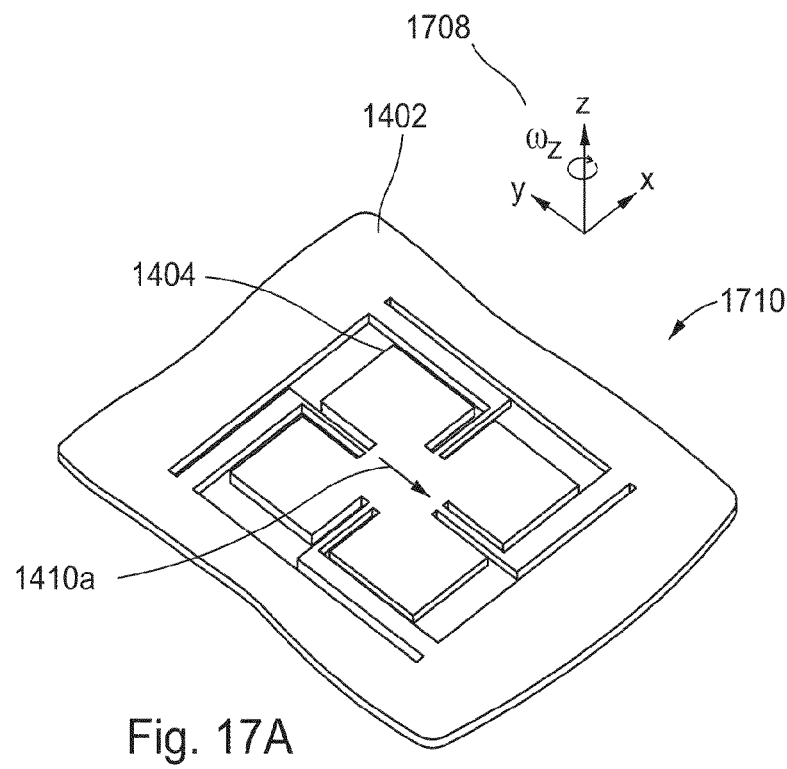
FIG. 17A-D illustrate the sequence of the operation of a gyroscope operating in the first y-direction mode as the exciting mode.
Figure 17B:
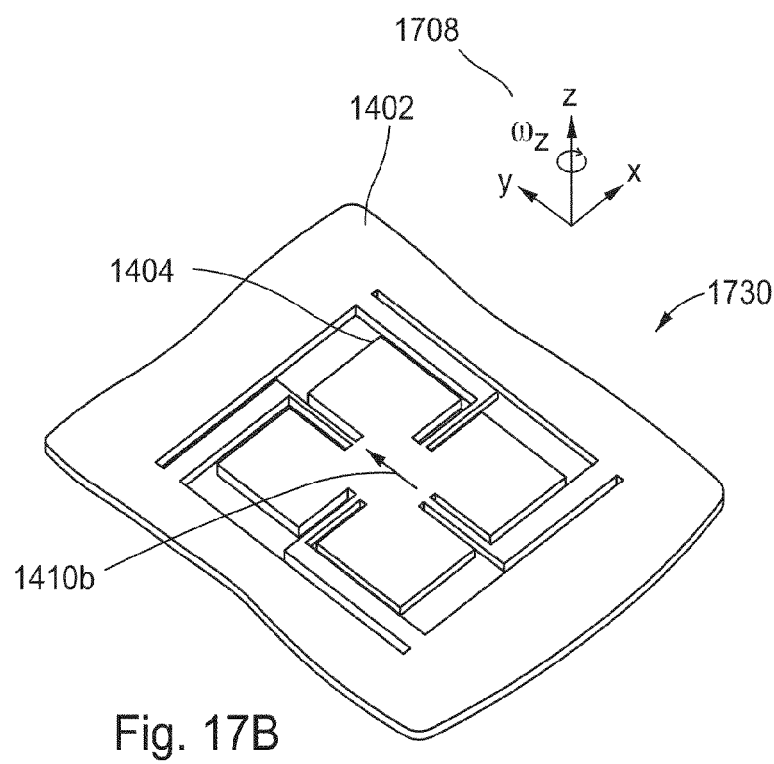
Figure 17C:
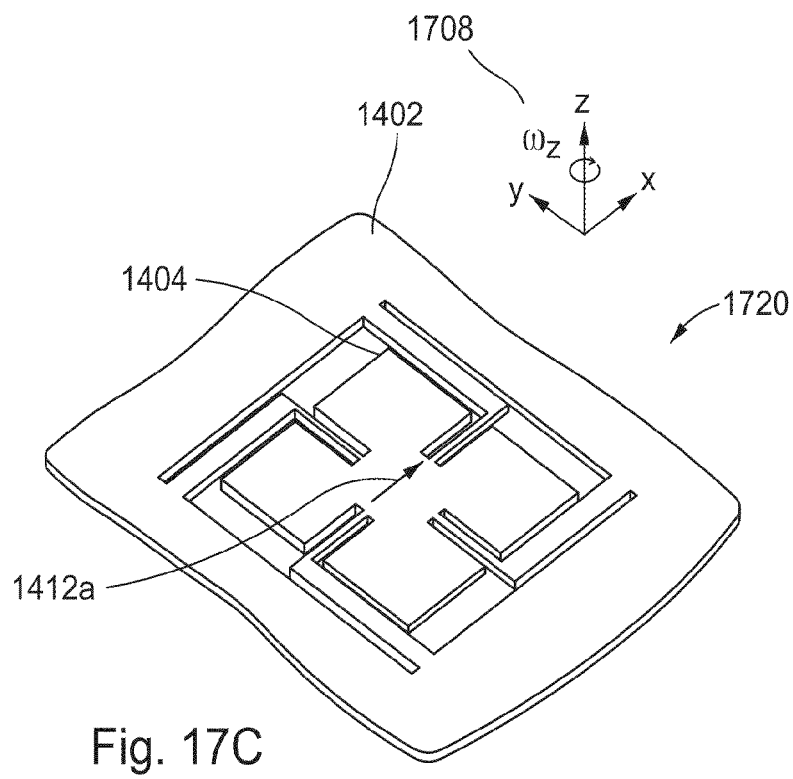

FIG. 17A-17D show gyroscopes using the two modes illustrated in FIGS. 14A and B and FIGS. 15A and B. FIG. 14A shows the structure 1400 and angular rate $\omega_z$ 1708 about the z-axis. The initial in-plane y direction mode is shown by the arrow 1410a in FIG. 17A. The Coriolis force resulting from the proof mass motion in FIG. 17A and the angular rotation $\omega_z$ 1708, transfers energy between the y-direction mode in FIG. 17A to the x-direction mode in FIG. 17C. As a result the x-direction mode in FIG. 17C is excited with the motion shown with arrow 1412a.

Figure 17D:
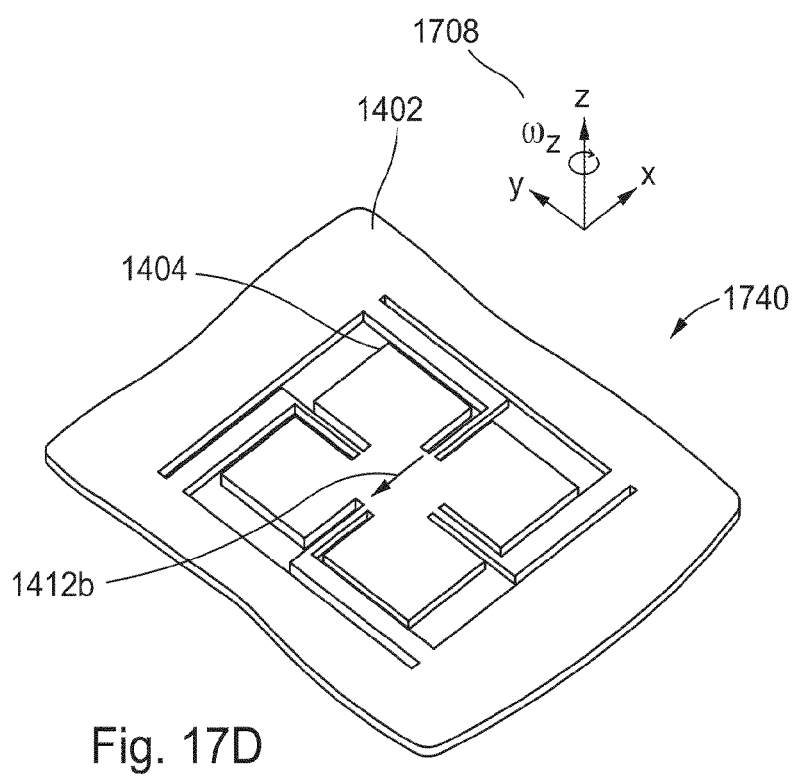

During the second half cycle of the motion of the proof mass motion of FIG. 17A, shown in FIG. 17B, the motion of 1410a is reversed, as indicated with 1410b. As a result for the angular rate $\omega_z$ 1708, the resulting Coriolis acceleration can cause the mode coupling between the y-direction mode in FIG. 17B and the x-direction mode illustrated in FIG. 17D. As a result the x-direction mode in FIG. 17D is excited with the motion with arrow 1412b.

The sequence in FIG. 17A-D is intended to illustrate the relationship of how the angular rate can cause the initial motion (FIG. 17A, B) to excite the second motion (FIG. 17C, D).

Instead of using the initial motion to excite the secondary motion, the second motion can be used to excite the first motion. In some embodiments, whether the initial motion excites the second motion or whether the second motion excites the initial motion can be based on the operating scheme, and whether one of these modes is operated at its resonance frequency.

Figure 18A:
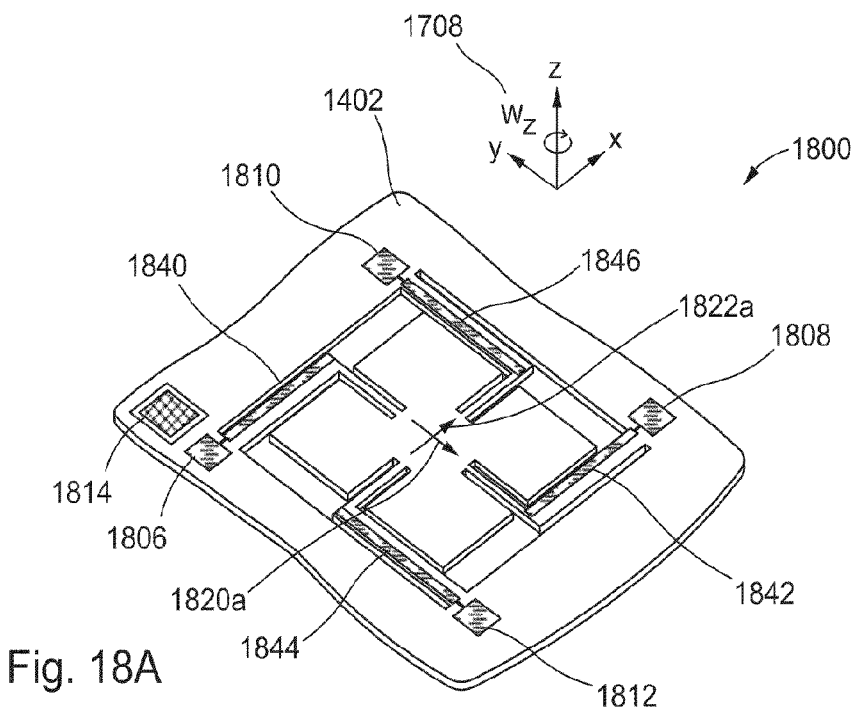
FIGS. 18A and 18B illustrate the operation of a gyroscope with actuation and sensing using the first y-direction mode as the exciting mode.

As shown in FIGS. 16A and B, a piezoelectric thin film can be used to excite the in-plane modes in y and x directions using the inverse piezoelectric effect. Both structures can also be operated as a sensor to sense the existence of these respective modes using the direct piezoelectric effect. In order to use the illustrated principle of excitation and sensing of the two modes illustrated in FIG. 17A-D, we now combine the electrode configurations of FIG. 16A and FIG. 16B, e.g., combine the structure operating in the y-direction mode with the structure operating in the y-direction mode to obtain a new structure 1800 illustrated in FIGS. 18A and B. We will assume that the y-direction mode motion is the driven motion, indicated by the arrow 1820a. This motion can be excited via the inverse piezoelectric effect and the application of an alternating voltage to the pads 1806 and 1808 connected to the electrodes 1840 and 1842. The other anchors of the structure can be covered by the electrode 1844 and 1846 that are used in this case to sense the motion of the proof mass in the x-direction.

For the case of no angular rate, i.e. $\omega_z$ 1708 being zero, no Coriolis force exists. In this case the proof mass can be excited in the y-direction mode. This motion may not create any net signal on the x-direction mode electrodes 1844 and 1846. As a result for the angular rate $\omega_z$ 1708 being zero no voltage or current may be detected between the output pads 1810 and 1812 and the ground pad 1814.

In reality small asymmetries during the fabrication or cross-talk can induce a small signal in the output electrode despite the angular rate being zero. However, the amplitude of this unwanted signal may not depend on the Coriolis force and as a result can be easily dealt with by the circuit or by signal processing.

Figure 18B:
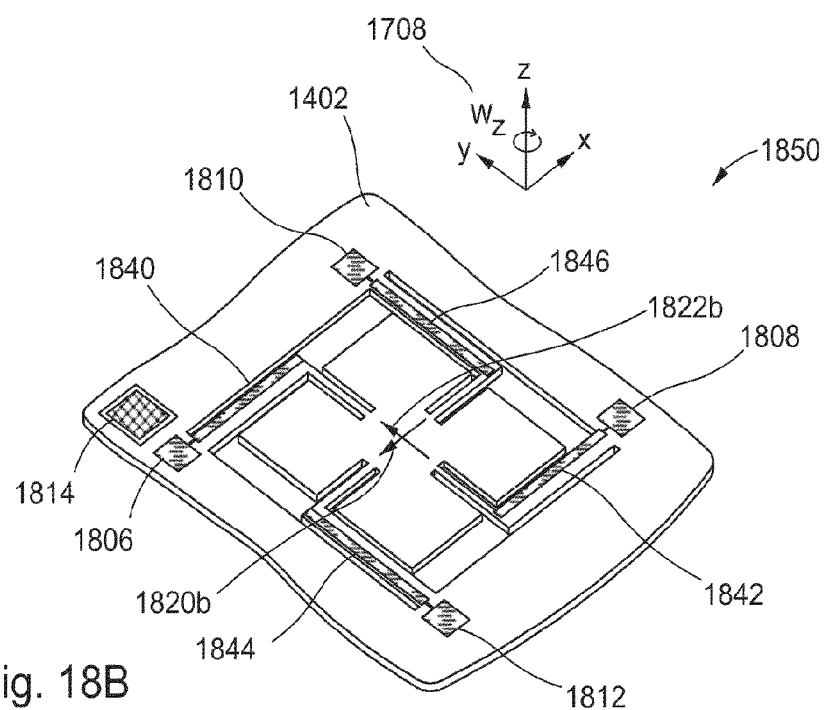

In case of a non-zero angular rate $\omega_z$ 1708, the Coriolis force in combination with the actively driven y-direction in-plane mode can cause the energy coupling between the in-plane y-direction and x-direction modes, as had been shown above in FIG. 17A-D. During the first half cycle, illustrated in FIG. 18A the motion of 1820a together with non-zero angular rate $\omega_z$ 1708 can cause a motion of the proof mass along 1822a. During the latter half-cycle the direction 1820b of the y-direction mode can be reversed and as a result the proof mass through the Coriolis force experiences the reversed motion according to 1822b. The x-direction motion of proof mass can piezoelectrically induce charges on the electrodes 1844 and 1846. As a result of the angular rate $\omega_z$ 1708 being non-zero a voltage or current can be detected between the output pads 1810 and 1812 the ground pad 1814 shown in FIG. 18B.

Figure 19:
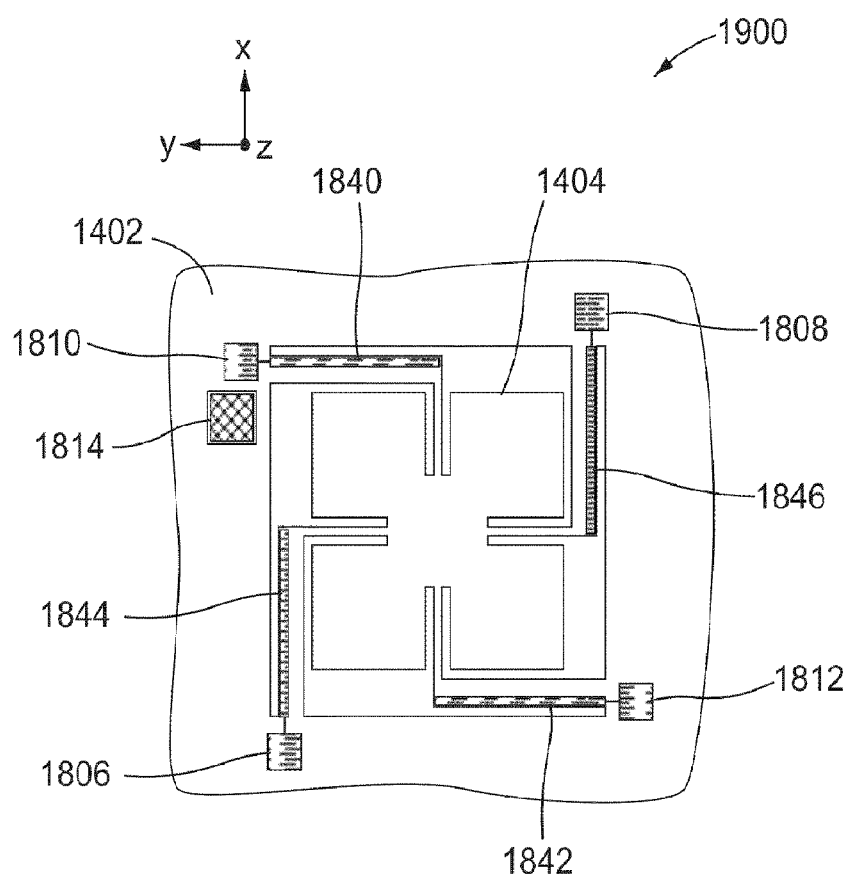
FIG. 19 is a top view showing different electrode geometries for differential drive and sense techniques for the gyroscope shown in FIGS. 18A and 18B.

The drive and sense of the proof mass structure can be done differentially, for example as described with respect to differentially driven and sensed structures in above-referenced U.S. patent application Ser. No. 12/639,260. For example in order to drive the y-direction mode differentially in FIG. 19, a positive and negative voltage can be applied on the electrodes 1844 and 1846. In the presence of an angular rate $\omega_z$ 1708, the Coriolis force can excite the x-direction mode and the motion of this mode induces negative and positive charges on the electrodes 1840 and 1842. This motion can be detected differentially. In one embodiment, the drive and sense can be done differentially if the x-direction mode can be used to drive the proof mass and the y-direction mode is used to sense the Coriolis acceleration. Electrode configuration is not limited to FIG. 19. Any of electrodes 1844, 1845, 1846 and 1847 or different combinations of them can be used for exciting the proof mass in y-direction. Any of electrodes 1840, 1841, 1842 and 1843 or different combinations of them can be used to sense the motion of the proof mass in x-direction.

The layout of the electrodes 1840, 1842, 1844 and 1846 can relate to exciting one mode and at the same time detect the orthogonal mode excited through the angular rate and the Coriolis force, without creating cross-talk between these two modes. To reduce cross-talk, or increase the amplitude of the sense electrode and prevent any asymmetric motion of the plate, the electrode geometries 1840, 1842, 1844 and 1846 can be optimized.

Figure 20A:
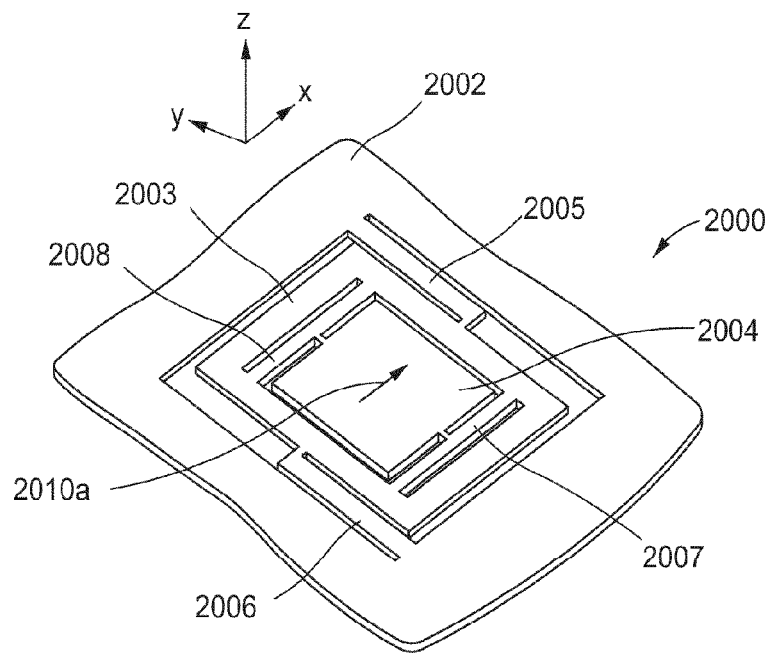
FIG. 20A is a perspective view of a gyroscope operating in the x-direction in-plane mode according to an embodiment in the first configuration.
Figure 20B:
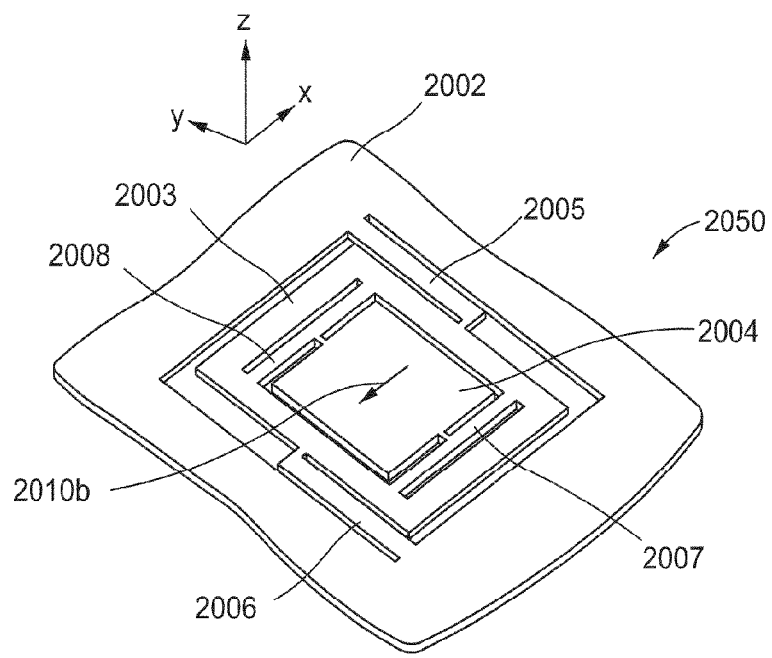
FIG. 20B is a perspective view of the gyroscope shown in FIG. 20A in the second configuration.

Another embodiment of a piezoelectric gyroscope according to the aspects described herein may employ a double mass plate structure. A double mass plate structure 2000 is shown in FIG. 20A. The suspended proof mass 2004 can be coupled to another mass 2003 through anchors 2007 and 2008. The mass 2003 is connected to a substrate 2002 using two anchors 2005 and 2006. In some embodiments, more or fewer anchors can be included. Proof masses 2003 and 2004 can be driven in their in-plane x-direction mode. The motion of the proof masses in this mode is indicated by the arrow 2010*a*. The vibration of the proof masses for the other half cycle is illustrated in FIG. 20B. The arrow indicates the motion of the masses according to the arrow 2010*b*.

Figure 21A:
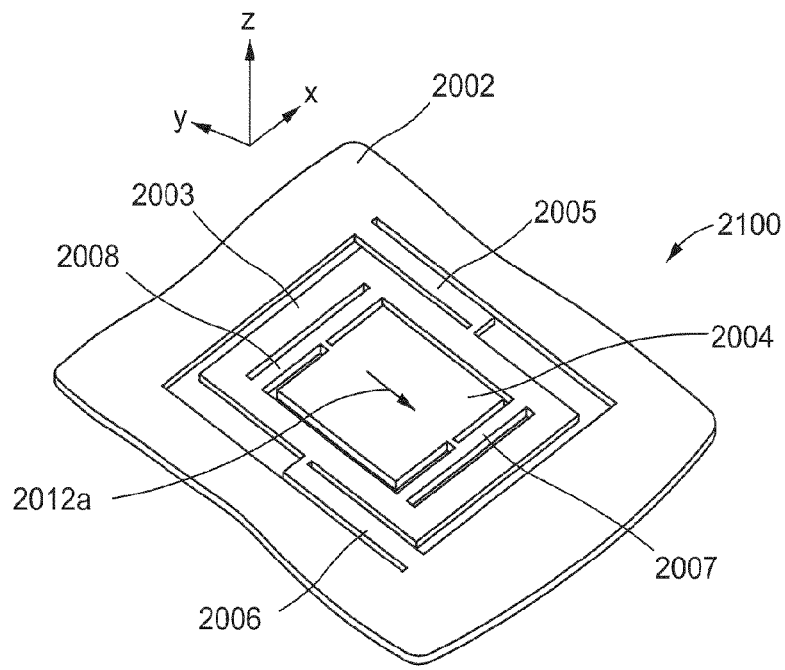
FIG. 21A is a top view of a gyroscope operating in the y-direction in-plane mode according to an embodiment in the first configuration.
Figure 21B:
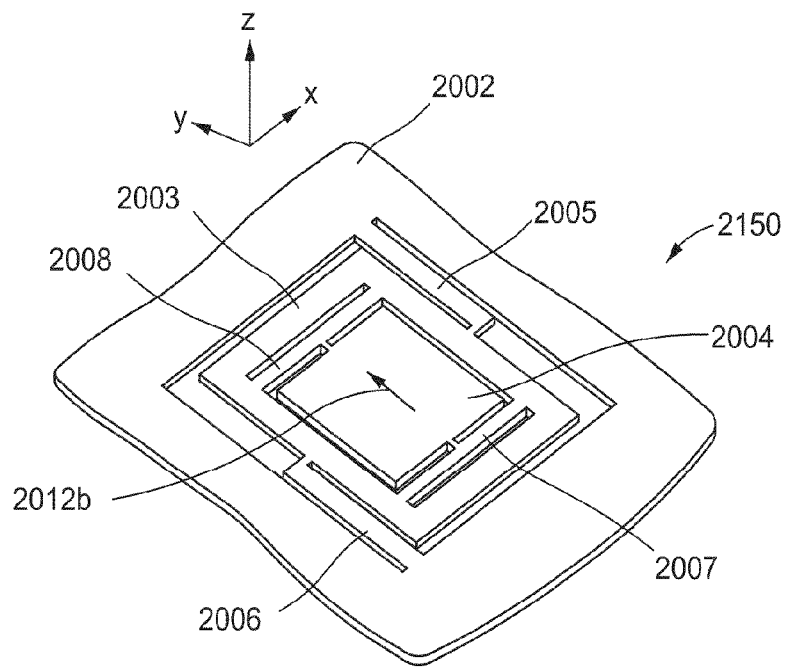
FIG. 21B is a top view of the gyroscope shown in FIG. 21A in the second configuration.

Another in-plane mode in y-direction is illustrated in FIG. 21A. The arrow 2012*a* illustrates the motion of the masses. On the second half cycle of the motion the masses can move according to the arrow 2012*b*, illustrated in FIG. 21B.

Figure 22A:
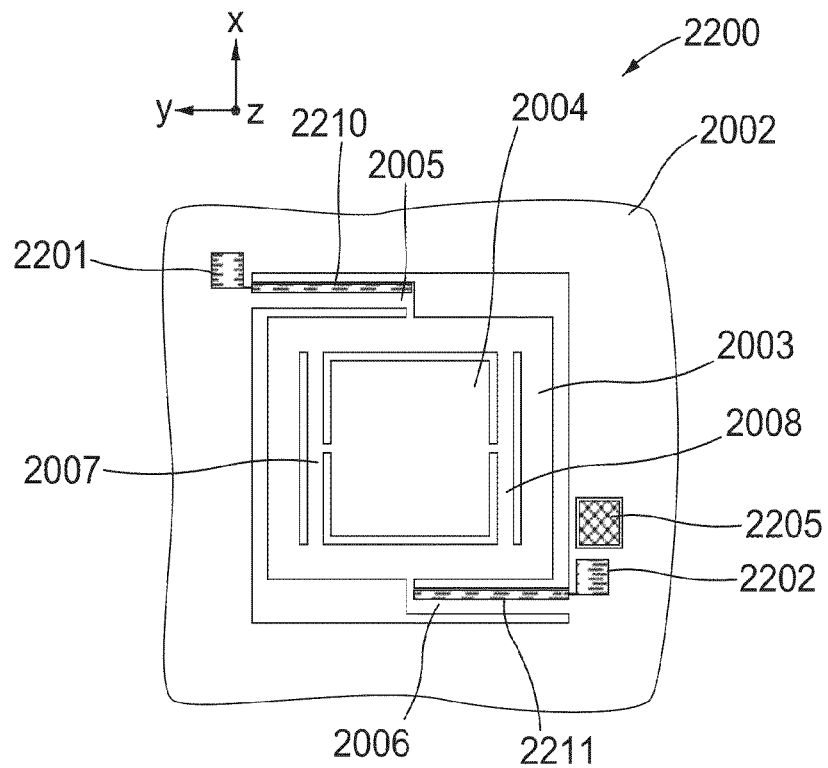
FIG. 22A is a top view of top electrodes on a piezoelectric thin film to excite or sense the modes illustrated in FIGS. 20A and 20B.

FIG. 22A shows the top view of one embodiment of how the in-plane x-direction modes illustrated in FIGS. 20A and B can be excited. In order to excite the x-direction mode, the electrodes 2210 and 2211 can be located on the anchors 2005 and 2006.

The structure of FIGS. 22A and 22B may have a similar cross-section as previously shown and described in connection with FIG. 4A, having the same reference numbers. The proposed structure uses a piezoelectric thin film 402 on top of another layer 404, where this layer 404 can be composed of one or more layers, and can include a temperature compensated stack, for example of the type described with respect to temperature compensated resonating structures in U.S. patent application Ser. No. 12/639,161, filed on Dec. 16, 2009 and entitled "Mechanical Resonating Structures Including a Temperature Compensation Structure" which is hereby incorporated herein by reference in its entirety, or be of a single material and can include a second piezoelectric layer. The piezoelectric thin film can be deposited on top of a conductive layer that is connected to the pad 2205. In some embodiments the surface, portions of or the entire layer 404 can be conductive and can be used instead of this additional conductive layer.

The structure can be suspended mechanically from the substrate 408 by using either a cavity below the device 410, performing a backside etch, can use a sacrificial layer or using a front-side under-etch of the double mass plate.

By applying a voltage between the respective electrodes 2210 and 2211 and the bottom electrode 2205, the piezoelectric layer can contract or expand based on the inverse piezoelectric effect.

The bottom electrode 2205 can be connected to ground. Applying for example a positive voltage to the top electrode 2210 and 2211 via the pad 2201 and 2202, the piezoelectric layer 402 can contract. As this film is clamped on the layer 404 the contraction can cause the anchors 2005 and 2006 to contract. As a result this actuation can cause the motion of the proof masses illustrated in FIG. 20A,B.

Figure 22B:
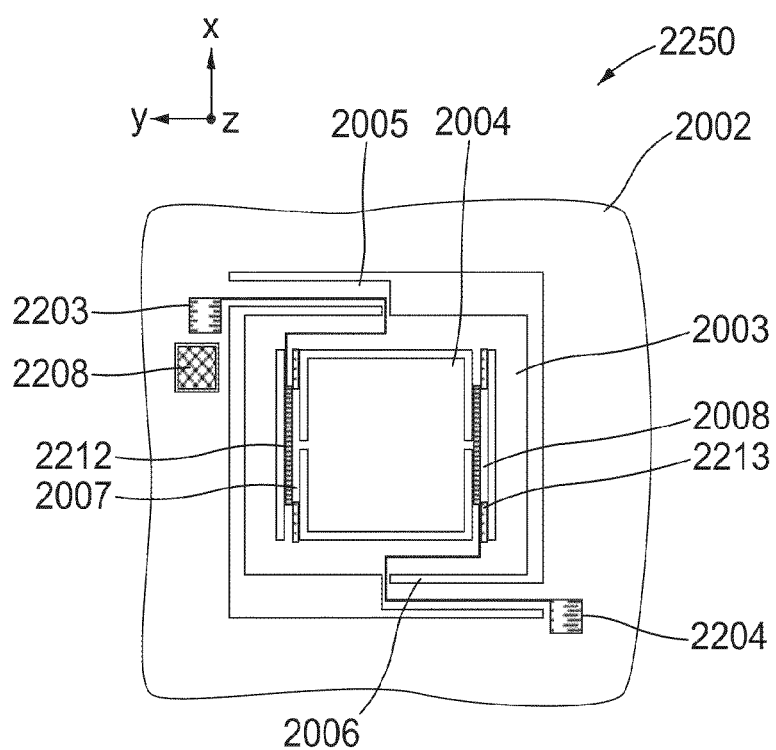
FIG. 22B is a top view of top electrodes on a piezoelectric thin film to excite or sense the modes illustrated in FIGS. 21A and 21B.

In FIG. 22B the top electrodes 2212 and 2213 are similar to the concept discussed in regards to FIG. 22A. They are located on the anchors 2007 and 2008. Bottom electrode 2208 is connected to ground. By applying a positive voltage to the top electrode 2212 and 2213 via the pad 2203 and 2204, the piezoelectric layer can contract and the underlying layer 404 clamped to the piezoelectric layer can contract. As this film is clamped on the layer 404 the contraction can cause the anchors 2007 and 2008 to contract. As a result this actuation can cause a motion of the proof masses similar to the illustration in FIG. 21A,B.

In FIG. 22B, the anchors 2007 and 2008 can be attached to the mass 2003. This can result in less rigid anchors and therefore higher quality factor for the y-direction mode.

Figure 23A:
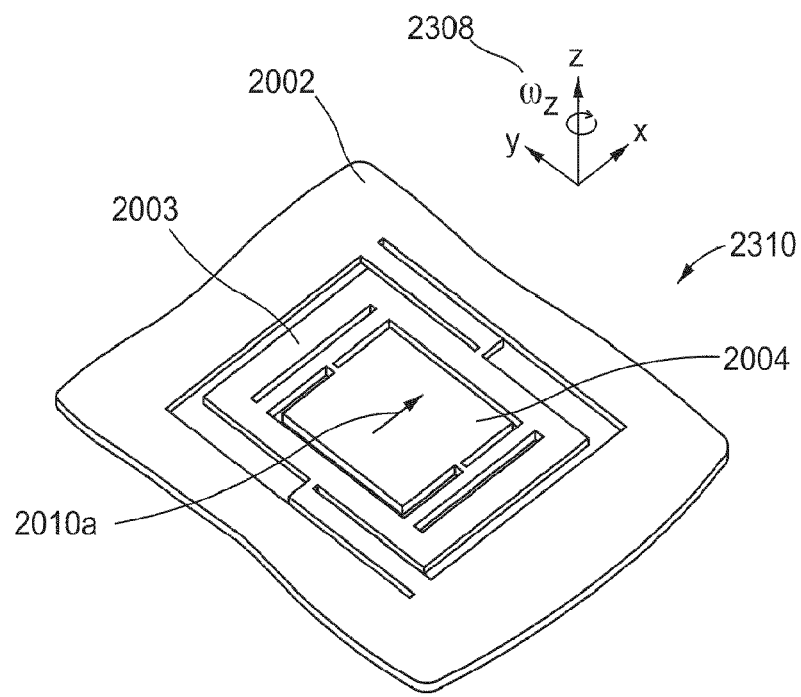
FIGS. 23A-D illustrate the sequence of the operation of a gyroscope operating in the first x-direction mode as the exciting mode.
Figure 23B:
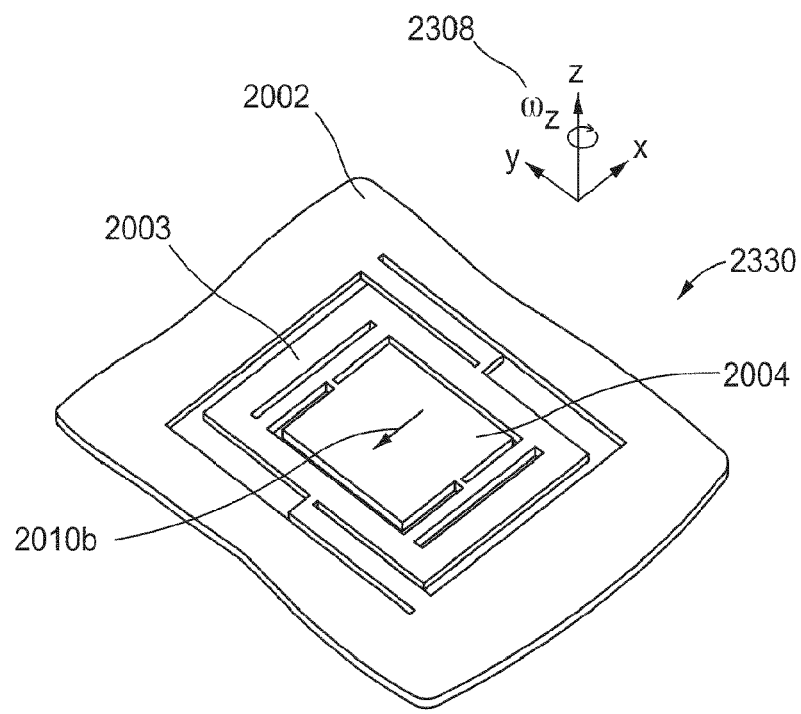
Figure 23C:
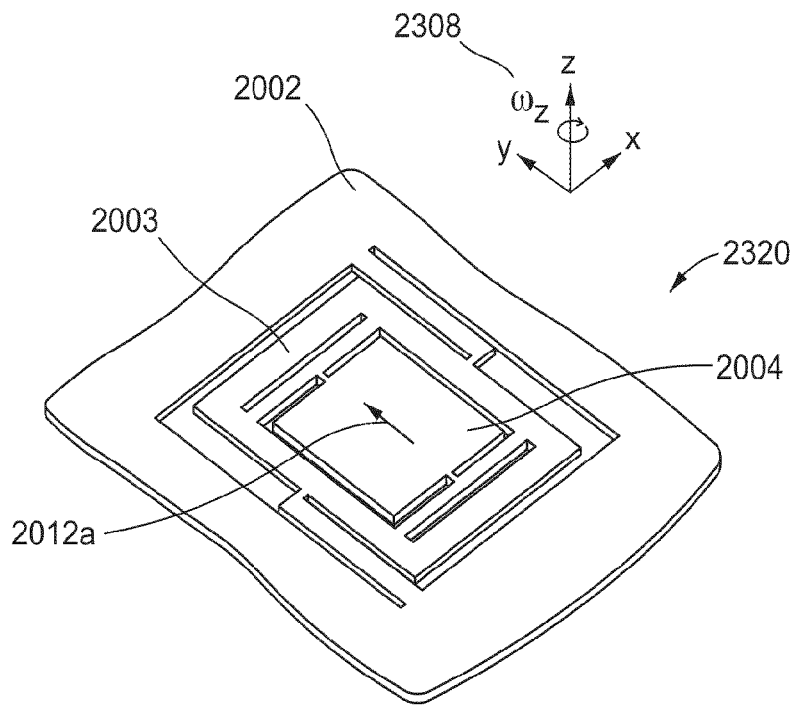

FIG. 23A through D show gyroscopes using the two modes illustrated in FIGS. 20A and B and FIGS. 21A and B. FIG. 20A shows the structure 2000 and angular rate $\omega_z$ 2308 about the z-axis. The initial in-plane x-direction mode is shown by the arrow 2010*a* in FIG. 23A. The Coriolis force resulting from the proof masses motion FIG. 23A and the angular rotation $\omega_z$ 2308, transfers energy between the x-direction mode in FIG. 23A to the y-direction mode in FIG. 23C. As a result the y-direction mode in FIG. 23C is excited with the motion shown with arrow 2012*a*.

Figure 23D:
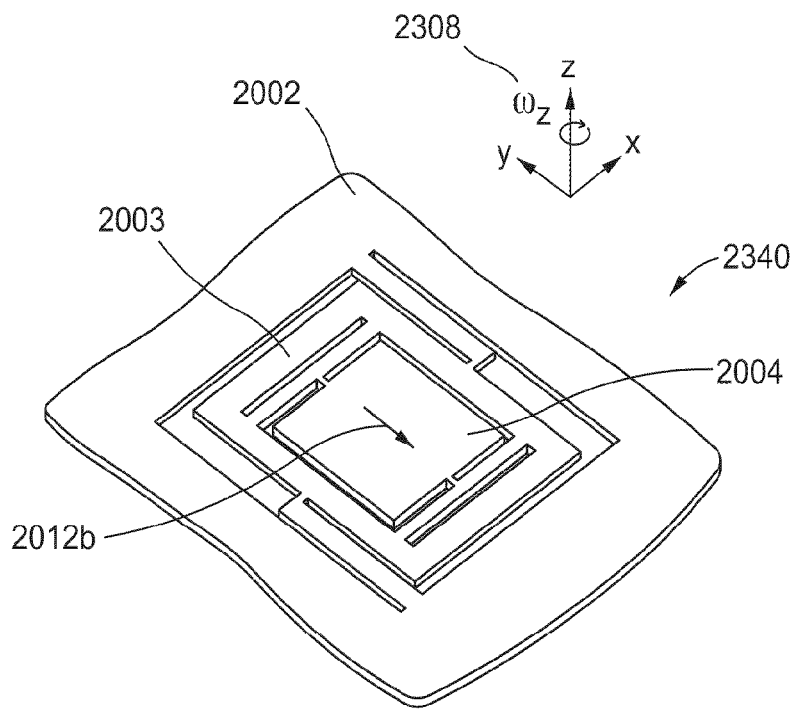

During the second half cycle of the motion of the proof masses motion of FIG. 23A, shown in FIG. 23B, the motion of 2310*a* can be reversed, as indicated with 2310*b*. As a result for the angular rate $\omega_z$ 2308, the resulting Coriolis acceleration can cause the mode coupling between the x-direction mode in FIG. 23B and the y-direction mode illustrated in FIG. 23D. As a result the y-direction mode in FIG. 23D is excited with the motion 2012*b*.

The sequence in FIG. 23A-D is intended to illustrate the relationship of how the angular rate causes the initial motion (FIG. 23A, B) to excite the second motion (FIG. 23C, D).

In principle, instead of using the initial motion to excite the secondary motion, the principle can be reversed and the secondary motion can be used to excite the initial motion. In some embodiments, whether the initial motion excites the second motion, or whether the second motion excites the initial motion can be based on the operating scheme, and whether one of these modes is operated at its resonance frequency.

Figure 24A:
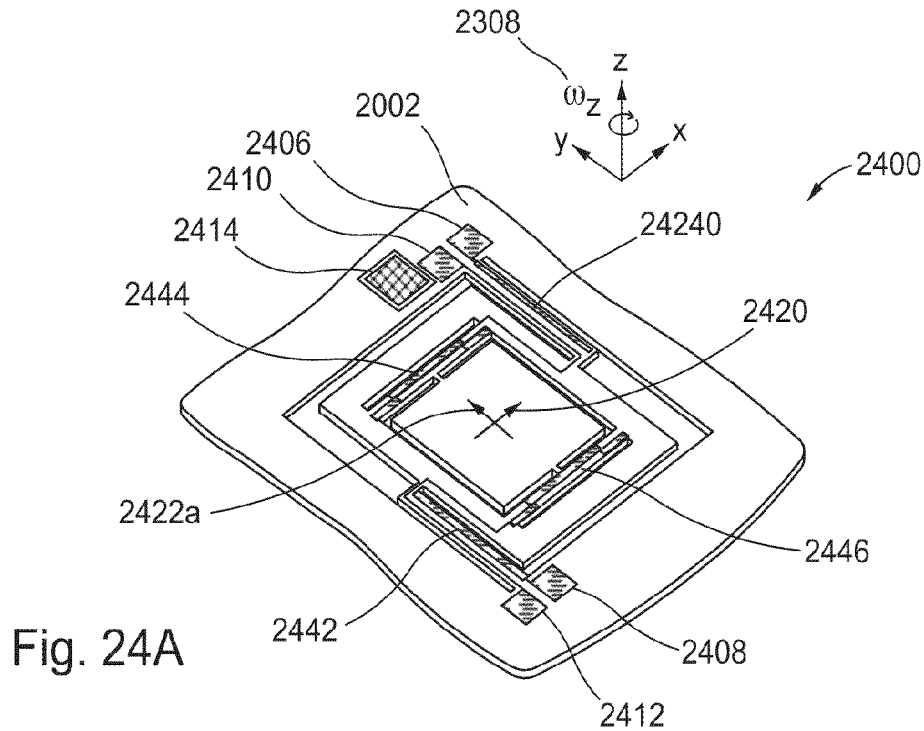
FIGS. 24A and 24B illustrates the operation of a gyroscope with actuation and sensing operating in the first x-direction mode as the exciting mode.

FIG. 22A shows a piezoelectric thin film can be used to excite the in-plane modes in x and y direction using the inverse piezoelectric effect. Both structures can also be operated as a sensor to sense the existence of these respective modes using the direct piezoelectric effect. In order to use the illustrated principle of excitation and sensing of the two modes illustrated in FIG. 23A-D, we now combine the electrode configurations of FIG. 22A and FIG. 22B, e.g., combine the structure operating in the y-direction mode with the structure operating in the y-direction mode, to obtain a new structure 2400 illustrated in FIGS. 24A and B. We will assume that the x-direction mode motion is the driven motion, indicated by the arrow 2420*a*. This motion can be excited via the inverse piezoelectric effect and the application of an alternating voltage to the pads 2406 and 2408 connected to the electrodes 2440 and 2442. The other anchors of the structure can be covered by the electrodes 2444 and 2446 that can be used in this case to sense the motion of the proof masses in y-direction.

For the case of no angular rate, i.e. $\omega_z$ 2308 being zero, no Coriolis force exists. In this case the proof masses can be excited in the x-direction mode. This motion mat not create any net signal on the y-direction mode electrodes 2444 and 2446. As a result for the angular rate $\omega_z$ 2308 being zero no voltage or current may be detected between the output pads 2410 and 2412 and the ground pad 2414.

In reality small asymmetries during the fabrication or cross-talk can induce a small signal in the output electrode despite the angular rate being zero. However, the amplitude of this unwanted signal may not depend on the Coriolis force and as a result can be easily dealt with by the circuit or by signal processing.

Figure 24B:
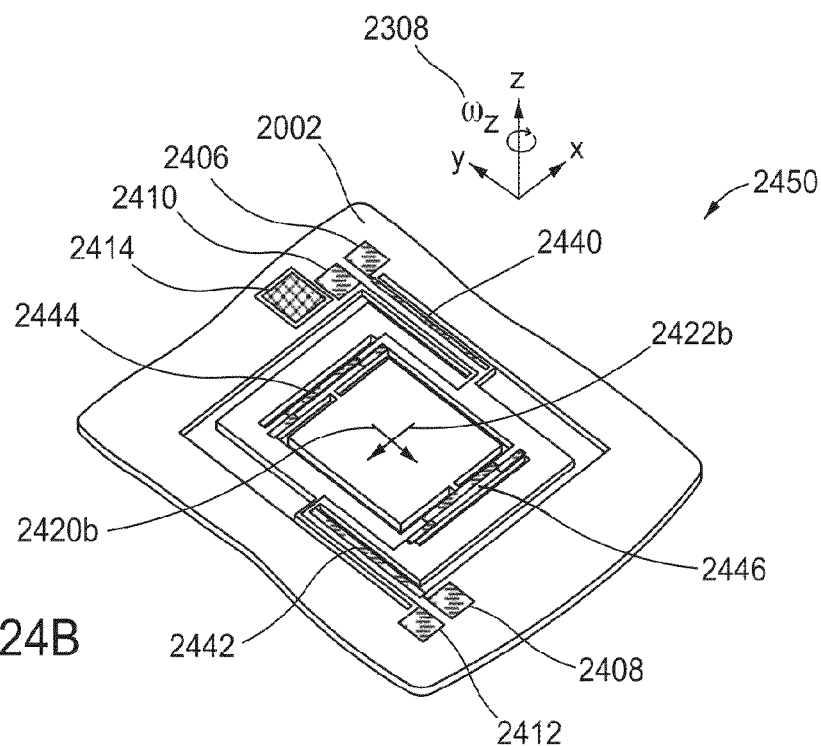

In case of a non-zero angular rate $\omega_z$ 2308 the Coriolis force in combination with the actively driven x-direction in-plane mode can cause the energy coupling between the in-plane x-direction and y-direction modes, as had been shown above in FIG. 23A-D. During the first half cycle, illustrated in FIG. 24A the motion of 2420a can cause a motion of the proof masses along 2422a. During the latter half-cycle the direction 2420b of the x-direction mode can be reversed and as a result the proof masses through the Coriolis force can experience the reversed motion according to 2422b. The y-direction motion of proof masses piezoelectrically can induce charges on the electrodes 2444 and 2446. As a result of the angular rate $\omega_z$ 2308 being non-zero a voltage or current can be detected between the output pads 2410 and 2412 and the ground pad 2414 shown in FIG. 24B.

There are advantages related to the using of a double mass plate structure. The first advantage is having larger mass compared to a single proof mass. Larger mass improves the sensitivity of the gyroscope. The second advantage of the double mass plate is that the anchors 2007 and 2008 in FIGS. 22A and 22B are not clamped to a rigid substrate such as 2002 in FIG. 22A. Instead these anchors are clamped to the moving mass 2003 in FIG. 22A. Therefore the quality factor of the y-direction mode can be improved significantly.

Figure 25:
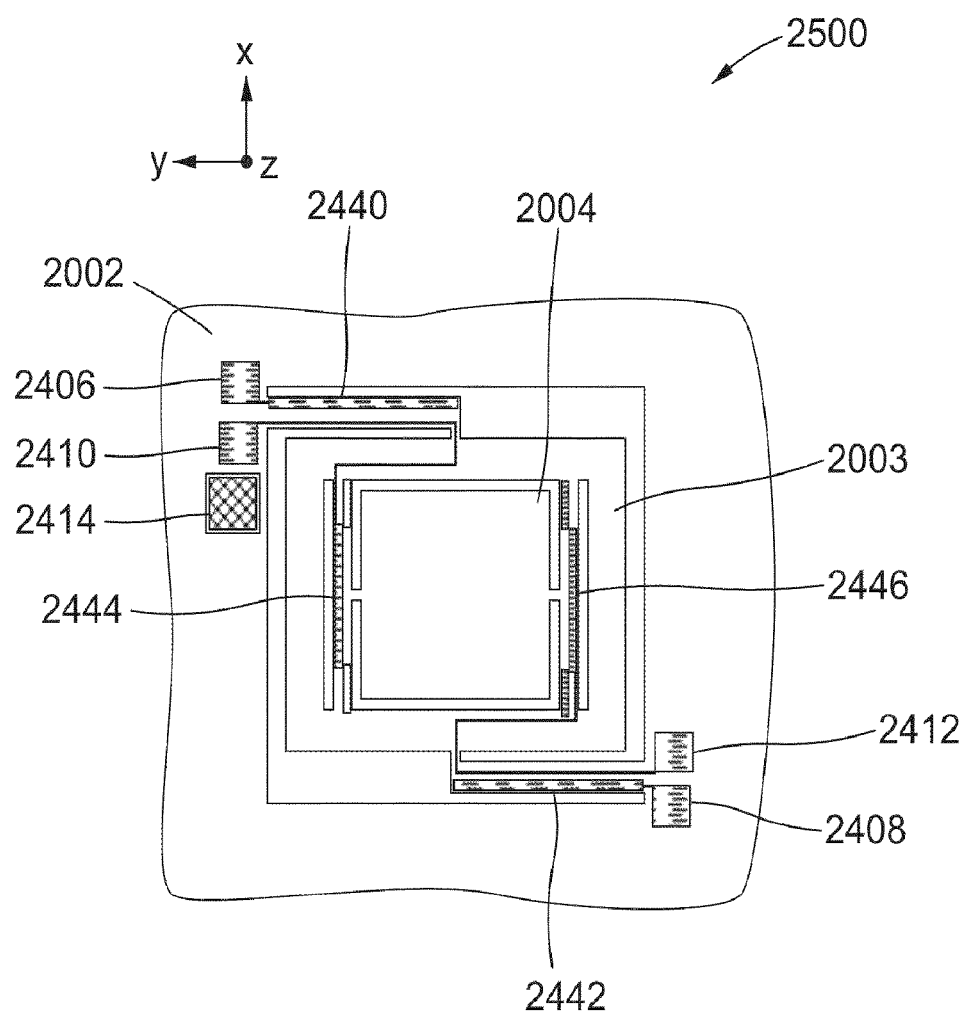
FIG. 25 is a top view showing different electrode geometries for differential drive and sense techniques for the gyroscope shown in FIGS. 24A and 24B.

The drive and sense of the proof masses structure can be performed differentially, for example as described with respect to differentially driven and sensed structures in above-referenced U.S. patent application Ser. No. 12/639, 260. For example, to drive the x-direction mode differentially in FIG. 25, a positive and negative voltage can be applied on the electrodes 2440 and 2442. In the presence of an angular rate $\omega_z$ 2308, the Coriolis force excites the y-direction mode and the motion of this mode induces negative and positive charges on the electrodes 2444 and 2446. This motion can be detected differentially. In one embodiment, the drive and sense can be done differentially if the y-direction mode is used to drive the proof masses and the x-direction mode can be used to sense the Coriolis acceleration.

The layout of the electrodes 2440, 2442, 2444 and 2446 can relate to exciting one mode and at the same time detecting the orthogonal mode excited through the angular rate and the Coriolis force, without creating cross-talk between these two modes. To reduce cross-talk, or increase the amplitude of the sense electrode and prevent any asymmetric motion of the plate, the electrode geometries 2440, 2442, 2444 and 2446 can be optimized.

Figure 26:
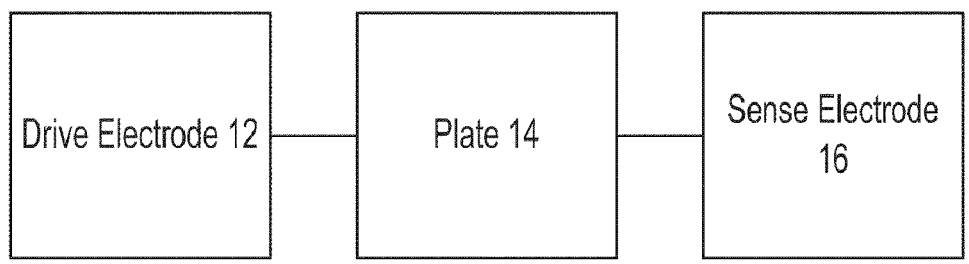
FIG. 26 shows a system block diagram of a resonant structure, according to an embodiment.

FIG. 26 shows a system block diagram of a resonant structure 10 according to an embodiment. As shown in FIG. 26, resonant structure 10 includes a plate 14, a drive electrode 12, and a sense electrode 16. Plate 14 of resonant structure 10 can include a disc shape, a ring shape, or one or more mass-proof(s). Drive electrode 12 is operatively coupled to plate 14 and can be configured to excite plate 14 in a mode, such as, for example, primary and/or secondary elliptical mode, primary and/or secondary flexural mode, and/or x-direction and/or y-direction in-plane mode. Sense electrode 16 can be configured to sense oscillations of plate 14 in response to excitation of plate 14 by drive electrode 12.

Figure 27:
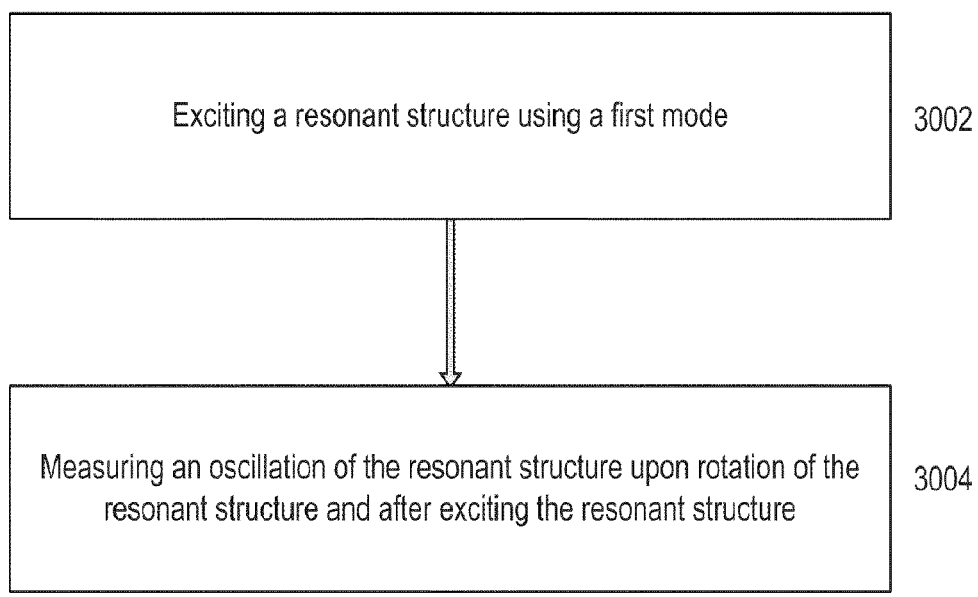
FIG. 27 shows a flow chart of a method for measuring oscillation, according to an embodiment.

FIG. 27 shows a flow chart of a method for measuring excitation, such as, for example, oscillation, according to an embodiment. As shown in FIG. 27, a resonant structure can be excited using a first mode, at 3002. The excitation can be measured, at 3004. The resonant structure can correspond to any of the embodiments described above and the plate can be excited in any appropriate manner as described above, for example, in connection with FIGS. 1-26. The resonant structure can include a set of electrodes that excite the plate.

According to one aspect, a piezoelectric gyroscope of the type described herein may be substantially planar, and the resonating structure can undergo displacement substantially in one direction (e.g., an x-direction), with less substantial displacement in the other directions (e.g., the y- and z-directions). A piezoelectric gyroscope of the type described herein can be used such that the resonating structure undergoes displacement substantially in two directions (e.g., an x- and y-direction), with less substantial displacement in the other direction (e.g., the z-directions). Such modes may be described as extensional modes of vibration or in-plane flexural modes of vibration.

According to one aspect, a piezoelectric gyroscope of the type described herein may be integrated with one or more additional devices. For example, a z-axis piezoelectric gyroscope may be integrated on a single chip with an xy-axis piezoelectric gyroscope. According to another embodiment, a z-axis piezoelectric gyroscope of the type described herein may be integrated on a single chip with a timing oscillator comprising a piezoelectric resonator. According to one aspect, the piezoelectric structures according to any of the embodiments described herein may be operated as resonators for a timing oscillator, thus being used to generate a reference timing signal. Accordingly, in one aspect of the present invention, two such structures may be formed on a single chip (e.g., substantially next to each other or in any other relative position), with one being operated as described herein as a z-axis gyroscope and the other being operated as part of a timing oscillator, thus forming a timing and inertial motion unit (TIMU). In other embodiments, z-axis gyroscopes as described herein may be integrated on a single chip with an accelerometer, a magnetometer, or any other suitable piezoelectric device.

While various embodiments have been described above, it should be understood that they have been presented by way of example only, and not limitation. Where methods and steps described above indicate certain events occurring in certain order, the ordering of certain steps may be modified. Additionally, certain of the steps may be performed concurrently in a parallel process when possible, as well as performed sequentially as described above. The embodiments have been particularly shown and described, but it will be understood that various changes in form and details may be made. For example, although various embodiments have been described as having particular features and/or combinations of components, other embodiments are possible having any combination or sub-combination of any features and/or components from any of the embodiments described herein.

What is claimed is:

1. A microelectromechanical resonant structure, comprising:
   a plate comprising a crystalline support and a piezoelectric thin film coupled to the crystalline support, the plate defining a plane when the resonant structure is not excited and the crystalline support exhibiting in-plane anisotropy within the plane;
   a drive electrode configured to excite the plate in a first in-plane mode having a first resonance frequency; and
   a sense electrode configured to sense motion of the plate in a second in-plane mode having a second resonance frequency and produce a signal in response to rotation of the resonant structure about an axis substantially orthogonal to the plane defined by the plate when the resonant structure is not excited,
   wherein the drive electrode and the sense electrode are arranged on the plate relative to a crystalline direction of the crystalline support such that the first resonance frequency and second resonance frequency are substantially equal.

2. The microelectromechanical resonant structure of claim 1, wherein the plate is configured to oscillate in the second in-plane mode upon rotation about the axis.

3. The microelectromechanical resonant structure of claim 2, wherein each of the first in-plane mode and the second in-plane mode is one of an elliptical mode or a flexural mode.

4. The microelectromechanical resonant structure of claim 2, wherein the first in-plane mode and the second in-plane mode are spatially rotated with respect to each other.

5. The microelectromechanical resonant structure of claim 4, wherein the first in-plane mode and the second in-plane mode are rotated relative to each other by approximately 45 degrees.

6. The microelectromechanical resonant structure of claim 2, wherein the drive electrode is configured to excite the plate in the first in-plane mode at a frequency corresponding to the second resonance frequency.

7. The microelectromechanical resonant structure of claim 1, wherein the plate includes at least one of a disk, a ring, a proof mass, or a double mass plate.

8. The microelectromechanical resonant structure of claim 1, further comprising:
   a substrate, the plate being suspended and coupled to the substrate by a plurality of anchors.

9. The microelectromechanical resonant structure of claim 8, wherein at least one anchor from the plurality of anchors is a multi-element anchor.

10. The microelectromechanical resonant structure of claim 1, further comprising a temperature compensation stack coupled to the piezoelectric thin film.

11. The microelectromechanical resonant structure of claim 1, wherein the piezoelectric thin film is a disk-shaped piezoelectric thin film.

12. The microelectromechanical resonant structure of claim 1, wherein the piezoelectric thin film is coupled to a conductive layer.

13. The microelectromechanical resonant structure of claim 1, wherein the crystalline support is silicon.

14. The microelectromechanical resonant structure of claim 1, wherein the drive electrode is a first drive electrode, and wherein the microelectromechanical resonant structure includes a plurality of drive electrodes including the first drive electrode, wherein the plurality of drive electrodes are configured to excite the plate differentially.

15. The microelectromechanical resonant structure of claim 1, wherein the sense electrode is a first sense electrode, and wherein the microelectromechanical resonant structure includes a plurality of sense electrodes including the first sense electrode, wherein the plurality of sense electrodes are configured to sense motion of the plate differentially.

16. The microelectromechanical resonant structure of claim 1, further comprising:
   a microelectromechanical system (MEMS) accelerometer, the MEMS accelerometer and the plate being integrated on a common chip.

17. The microelectromechanical resonant structure of claim 1, further comprising:
   a microelectromechanical system (MEMS) timing oscillator, the MEMS timing oscillator and the plate being integrated on a common chip.

18. The microelectromechanical resonant structure of claim 1, wherein the plate is a first plate, and wherein the microelectromechanical resonant structure further comprises a second plate integrated on a common chip with the first plate and comprising a piezoelectric thin film and a crystalline support.

19. A microelectromechanical resonant structure, comprising:
   a drive electrode configured to excite a plate of the microelectromechanical resonant structure in a first in-plane mode having a first resonance frequency, the plate configured to oscillate in a second in-plane mode having a second resonance frequency when excited by the drive electrode and upon rotation of the microelectromechanical resonant structure about an axis substantially orthogonal to a plane defined by the plate when the microelectromechanical resonant structure is not excited, wherein the plate comprises a crystalline support, exhibiting in-plane anisotropy within the plane, and a piezoelectric thin film coupled to the crystalline support; and
   a sense electrode configured to sense the oscillation of the plate in the second in-plane mode,
   wherein the drive electrode and the sense electrode are arranged relative to a crystalline direction of the crystalline support such that the first resonance frequency and second resonance frequency are substantially equal.

20. A method, comprising:
   exciting, by a drive electrode, a plate of a resonant structure in a first in-plane mode having a first resonance frequency, the plate comprising a crystalline support, exhibiting in-plane anisotropy within a plane in which the plate lies, and a piezoelectric thin film coupled to the crystalline support; and
   measuring, by a sense electrode, an oscillation of the plate in a second in-plane mode having a second resonance frequency upon rotation of the resonant structure and after exciting the plate,
   wherein the drive electrode and the sense electrode are arranged on the plate relative to a crystalline direction of the crystalline support such that the first resonance frequency and second resonance frequency are substantially equal.

21. The method of claim 20, wherein:
measuring the oscillation includes measuring the oscillation of the plate upon rotation of the resonant structure about an axis substantially orthogonal to the plane.

* * * * *